(12) United States Patent
Droz et al.

(10) Patent No.: US 11,460,575 B1
(45) Date of Patent: Oct. 4, 2022

(54) LASER DIODE TIMING FEEDBACK USING TRACE LOOP

(71) Applicant: Waymo LLC, Mountain View, CA (US)

(72) Inventors: Pierre-yves Droz, Los Altos, CA (US); Gaetan Pennecot, San Francisco, CA (US)

(73) Assignee: Waymo LLC, Mountain View, CA (US)

( * ) Notice: Subject to any disclaimer, the term of this patent is extended or adjusted under 35 U.S.C. 154(b) by 1163 days.

(21) Appl. No.: 15/992,340

(22) Filed: May 30, 2018

Related U.S. Application Data

(63) Continuation of application No. 15/728,065, filed on Oct. 9, 2017, now Pat. No. 10,007,000, which is a continuation of application No. 14/039,817, filed on Sep. 27, 2013, now Pat. No. 9,784,835.

(51) Int. Cl.
| | | |
|---|---|---|
| *G01S 17/08* | (2006.01) | |
| *G08G 1/16* | (2006.01) | |
| *G01S 7/481* | (2006.01) | |
| *G01S 7/486* | (2020.01) | |
| *G01S 7/4865* | (2020.01) | |

(52) U.S. Cl.
CPC ............... *G01S 17/08* (2013.01); *G08G 1/16* (2013.01); *G01S 7/4817* (2013.01); *G01S 7/4865* (2013.01)

(58) Field of Classification Search
CPC ...... G01S 17/08; G01S 7/4865; G01S 7/4817; G08G 1/16

USPC .......................................................... 356/4.01
See application file for complete search history.

(56) References Cited

U.S. PATENT DOCUMENTS

| | | |
|---|---|---|
| 3,790,277 A | 2/1974 | Hogan |
| 4,044,299 A | 8/1977 | Weber |
| 4,700,301 A | 10/1987 | Dyke |
| 4,709,195 A | 11/1987 | Hellekeson et al. |
| 5,202,742 A | 4/1993 | Frank et al. |
| 6,795,319 B2 | 9/2004 | Preston et al. |
| 7,089,114 B1 | 8/2006 | Huang |
| 7,248,342 B1 | 7/2007 | Degnan |
| 7,255,275 B2 | 8/2007 | Gurevich et al. |
| 7,508,497 B2 | 3/2009 | LaBelle |
| 7,969,558 B2 | 6/2011 | Hall |
| 8,365,119 B2 | 1/2013 | Tell |
| 9,784,835 B1 * | 10/2017 | Droz ....................... G08G 1/166 |
| 10,007,000 B1 * | 6/2018 | Droz ....................... G01S 7/484 |
| 2008/0231388 A1 | 9/2008 | Kaehs |

(Continued)

*Primary Examiner* — Daniel L Murphy
(74) *Attorney, Agent, or Firm* — McDonnell Boehnen Hulbert & Berghoff LLP

(57) ABSTRACT

A laser diode firing circuit for a light detection and ranging (LIDAR) device that includes an inductively coupled feedback system is disclosed. The firing circuit includes a laser diode coupled in series with a transistor, such that current through the laser diode is controlled by the transistor. The laser diode is configured to emit a pulse of light in response to current flowing through the laser diode. A feedback loop is positioned to be inductively coupled to a current path of the firing circuit that includes the laser diode. As such, a change in current flowing through the laser diode induces a voltage in the feedback loop. A change in voltage across the leads of the feedback loop can be detected and the timing of the voltage change can be used to determine the time that current begins flowing through the laser diode.

20 Claims, 14 Drawing Sheets

(56) References Cited

U.S. PATENT DOCUMENTS

| | | |
|---|---|---|
| 2010/0062184 A1 | 3/2010 | Kaltenbach et al. |
| 2011/0319755 A1 | 12/2011 | Stein et al. |
| 2012/0248295 A1 | 10/2012 | Ito et al. |
| 2012/0283600 A1 | 11/2012 | Stein |
| 2013/0062500 A1 | 3/2013 | Oh et al. |
| 2013/0082604 A1 | 4/2013 | Williams et al. |
| 2013/0106468 A1 | 5/2013 | Aso |
| 2013/0131908 A1 | 5/2013 | Trepagnier et al. |
| 2013/0135053 A1 | 5/2013 | Tamanoi et al. |
| 2014/0350836 A1 | 11/2014 | Stettner et al. |

* cited by examiner

LASER DIODE TIMING FEEDBACK USING TRACE LOOP

CROSS-REFERENCE TO RELATED APPLICATIONS

This application is a continuation of U.S. patent application Ser. No. 15/728,065, filed Oct. 9, 2017, which is a continuation U.S. patent application Ser. No. 14/039,817, filed Sep. 27, 2013, now U.S. Pat. No. 9,784,835. The foregoing applications are incorporated herein by reference.

BACKGROUND

Unless otherwise indicated herein, the materials described in this section are not prior art to the claims in this application and are not admitted to be prior art by inclusion in this section.

Vehicles can be configured to operate in an autonomous mode in which the vehicle navigates through an environment with little or no input from a driver. Such autonomous vehicles can include one or more sensors that are configured to detect information about the environment in which the vehicle operates. The vehicle and its associated computer-implemented controller use the detected information to navigate through the environment. For example, if the sensor(s) detect that the vehicle is approaching an obstacle, as determined by the computer-implemented controller, the controller adjusts the vehicle's directional controls to cause the vehicle to navigate around the obstacle.

One such sensor is a light detection and ranging (LIDAR) device. A LIDAR actively estimates distances to environmental features while scanning through a scene to assemble a cloud of point positions indicative of the three-dimensional shape of the environmental scene. Individual points are measured by generating a laser pulse and detecting a returning pulse, if any, reflected from an environmental object, and determining the distance to the reflective object according to the time delay between the emitted pulse and the reception of the reflected pulse. The laser, or set of lasers, can be rapidly and repeatedly scanned across a scene to provide continuous real-time information on distances to reflective objects in the scene. Combining the measured distances and the orientation of the laser(s) while measuring each distance allows for associating a three-dimensional position with each returning pulse. A three-dimensional map of points of reflective features is generated based on the returning pulses for the entire scanning zone. The three-dimensional point map thereby indicates positions of reflective objects in the scanned scene.

SUMMARY

A laser diode firing circuit for a light detection and ranging (LIDAR) device that includes an inductively coupled feedback system is disclosed. The firing circuit includes a laser diode coupled in series with a transistor, such that current through the laser diode is controlled by the transistor. The laser diode is configured to emit a pulse of light in response to current flowing through the laser diode. The transistor is configured to begin conducting current in response to an initiating signal (e.g., applied to a base or gate terminal of the transistor). However, there may be some delay between application of the initiating signal and initiation of the current flowing through the transistor, and the transistor. A feedback loop is positioned to be inductively coupled to a current path of the firing circuit that includes the laser diode. As such, a change in current flowing through the laser diode (e.g., during firing of the laser diode) induces a current in the feedback loop. Monitoring a voltage across the leads of the feedback loop can thus be used to determine the time that current begins flowing through the laser diode, which is the pulse emission time.

Some embodiments of the present disclosure provide an apparatus. The apparatus can include a transistor, a light emitting element, a conductive loop, and a circuit. The transistor can be coupled to a current path and configured to change a current flow through the current path in response to an initiating signal. The light emitting element can be coupled to the transistor via the current path and configured to emit a light pulse responsive to the change in the current flow through the current path. The conductive loop can be proximate to the current path such that the change in current flow through the current path induces a voltage in the conductive loop. The circuit can be configured to detect the voltage induced in the conductive loop and to determine an emission time of the emitted light pulse based on the detected voltage.

Some embodiments of the present disclosure provide a method. The method can include applying an initiating signal to a transistor. The transistor can be coupled to a light emitting element via a current path and configured to change a current flow through the current path in response to the initiating signal. The light emitting element can be configured to emit a light pulse responsive to the change in the current flow through the current path. The method can include detecting, in a conductive loop proximate to the current path, a voltage induced by the change in the current flow through the current path. The method can include determining an emission time of the emitted light pulse based on the detected voltage.

Some embodiments of the present disclosure provide a light detection and ranging (LIDAR) device. The LIDAR device can include a light source, a light sensor, and a controller. The light source can include a transistor, a light emitting element, a conductive loop, and a circuit. The transistor can be coupled to a current path and configured to change a current flow through the current path in response to an initiating signal. The light emitting element can be coupled to the transistor via the current path and configured to emit a light pulse responsive to the change in the current flow through the current path. The conductive loop can be proximate to the current path such that the change in current flow through the current path induces a voltage in the conductive loop. The circuit can be configured to detect the voltage induced in the conductive loop and to determine an emission time of the emitted light pulse based on the detected voltage. The light sensor can be configured to detect a reflected light signal comprising light from the emitted light pulse reflected by a reflective object. The controller can be configured to determine a reception time of the reflected light signal distance and determine a distance to the reflective object based on the emission time and the reception time.

Some embodiments of the present disclosure provide a means for applying an initiating signal to a transistor. The transistor can be coupled to a light emitting element via a current path and configured to change a current flow through the current path in response to the initiating signal. The light emitting element can be configured to emit a light pulse responsive to the change in the current flow through the current path. Some embodiments of the present disclosure can include means for detecting, in a conductive loop proximate to the current path, a voltage induced by the change in the current flow through the current path. Some embodiments of the present disclosure can include means for determining an emission time of the emitted light pulse based on the detected voltage.

These as well as other aspects, advantages, and alternatives, will become apparent to those of ordinary skill in the art by reading the following detailed description, with reference where appropriate to the accompanying drawings.

DETAILED DESCRIPTION

I. Overview

Figure 1:
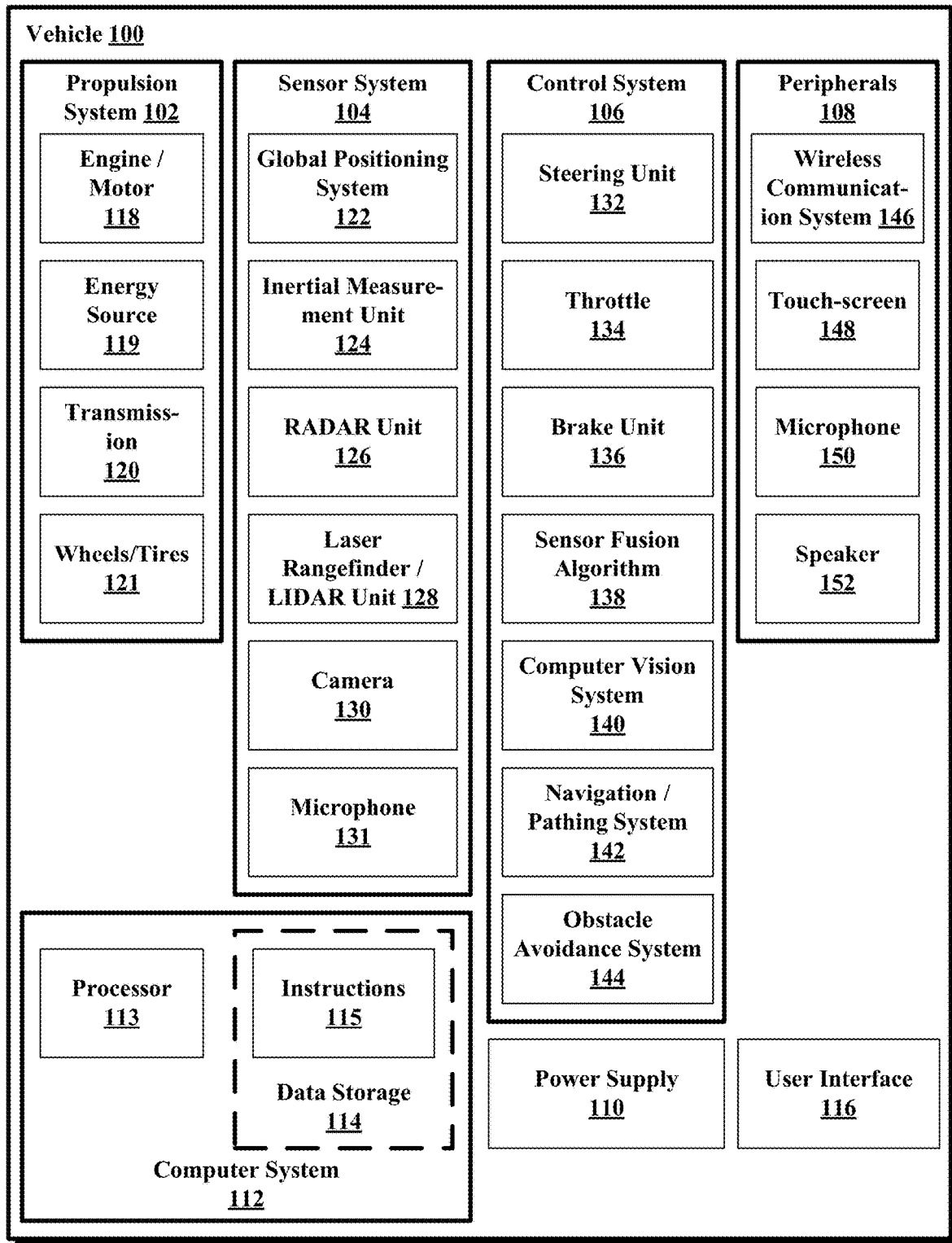
FIG. 1 is a functional block diagram depicting aspects of an example autonomous vehicle.

Example embodiments relate to an autonomous vehicle, such as a driverless automobile, that includes a light detection and ranging (LIDAR) sensor for actively detecting reflective features in the environment surrounding the vehicle. A controller analyzes information from the LIDAR sensor to identify the surroundings of the vehicle. The LIDAR sensor includes a light source that may include one or more laser diodes configured to emit pulses of light that are then directed to illuminate the environment surrounding the vehicle. Circuits for firing a laser diode and determining a pulse emission time from the laser diode are disclosed herein.

According to some embodiments, a LIDAR device includes one or more laser diode firing circuits in which a laser diode is connected in series with a transistor such that current through the laser diode is controlled by the transistor. The laser diode emits light in response to current flowing through the device, and so applying current to the laser diode results in emission of a pulse of light from the laser diode. The laser diode can emit light in the visible spectrum, ultraviolet spectrum, infrared spectrum, near infrared spectrum, and/or infrared spectrum. In one example, the laser diode emits pulses of infrared light with a wavelength of about 905 nm. An example firing circuit may switch from near zero current through the laser diode, to about 30 amperes in about 2 nanoseconds, and back to near zero in about 2 nanoseconds. Thus, the entire pulse cycle may take about 4 nanoseconds. However, such switching transistors may exhibit delays between the time an initiating signal is applied to turn on the transistor and the time that current begins flowing. In some cases, at least a portion of the delay may be due to systematic, substantially repeatable factors such as physical dimensions of the transistor, materials properties, carrier mobility, temperature and/or voltage dependence of circuit components, etc. A portion of the delay may also be a substantially random (i.e., non-repeatable) amount of jitter due to, for example, quantum effects in the transistor or other semiconductive components of the firing circuit. As a result, the timing of the initiating signal applied to the driving transistor may not be an accurate indicator of the pulse emission time. Such delays can lead to uncertainties in the resulting position estimation if not accounted for.

The present disclosure provides laser diode firing circuits that incorporate feedback to allow for determining the emission time of the light emitted from the laser diode. In some examples, feedback is provided by a conductive loop disposed proximate the firing circuit. The conductive loop acts as an antenna to detect changes in current flow in the firing circuit. Monitoring the leads of the conductive loop allows for detection of the pulse emission time, because a change in current in the firing circuit induces a voltage in the conductive loop current through the laser diode controlled by the transistor.

In some examples, the firing circuit is arranged with a current path through the laser diode and the series-connected transistor that at least partially follows the boundary of a closed shape (e.g., a boundary of a square, circle, polygon, etc.). As such, a change in current through the laser diode (and the associated current path) generates magnetic flux transverse to a plane of the current path. A conductive feedback loop can then be arranged to overlap the magnetic flux generation portions of the firing circuit's current path such that a change in current through the laser diode induces a voltage in the feedback loop. The voltage across leads of the feedback loop can then be used to detect the time that current begins flowing through the laser diode, and thus the time that a pulse is emitted from the LIDAR device. In some examples, a circuit may be used to condition the voltage across the leads to logic levels suitable for direct connection to a differential input on a field programmable gate array (FPGA) configured to control the timing of the LIDAR system.

The pulse emission time, so determined, is unaffected by timing jitter or other delays in the transistor controlling current to the laser diode. As a result, the timing uncertainty between pulse emission time and pulse reception time (from a reflected pulse) is reduced, and the corresponding distance to an environmental reflective object that reflects the light can be estimated with greater accuracy. In some examples, systems employing an inductively coupled feedback loop to determine a pulse emission time achieve a roundtrip timing uncertainty of about 100 picoseconds, which allows a corresponding distance measurement spatial resolution of about 1.3 centimeters.

II. Example Autonomous Vehicle System

Some aspects of the example methods described herein may be carried out in whole or in part by an autonomous vehicle or components thereof. However, some example methods may also be carried out in whole or in part by a system or systems that are remote from an autonomous vehicle. For instance, an example method could be carried out in part or in full by a server system, which receives information from sensors (e.g., raw sensor data and/or information derived therefrom) of an autonomous vehicle. Other examples are also possible.

Example systems within the scope of the present disclosure will now be described in greater detail. An example system may be implemented in, or may take the form of, an automobile. However, an example system may also be implemented in or take the form of other vehicles, such as cars, trucks, motorcycles, buses, boats, airplanes, helicopters, lawn mowers, earth movers, boats, snowmobiles, aircraft, recreational vehicles, amusement park vehicles, farm equipment, construction equipment, trams, golf carts, trains, and trolleys. Other vehicles are possible as well.

FIG. 1 is a functional block diagram illustrating a vehicle 100 according to an example embodiment. The vehicle 100 is configured to operate fully or partially in an autonomous mode, and thus may be referred to as an "autonomous vehicle." For example, a computer system 112 can control the vehicle 100 while in an autonomous mode via control instructions to a control system 106 for the vehicle 100. The computer system 112 can receive information from one or more sensor systems 104, and base one or more control processes (such as setting a heading so as to avoid a detected obstacle) upon the received information in an automated fashion.

The autonomous vehicle 100 can be fully autonomous or partially autonomous. In a partially autonomous vehicle some functions can optionally be manually controlled (e.g., by a driver) some or all of the time. Further, a partially autonomous vehicle can be configured to switch between a fully-manual operation mode and a partially-autonomous and/or a fully-autonomous operation mode.

The vehicle 100 includes a propulsion system 102, a sensor system 104, a control system 106, one or more peripherals 108, a power supply 110, a computer system 112, and a user interface 116. The vehicle 100 may include more or fewer subsystems and each subsystem can optionally include multiple components. Further, each of the subsystems and components of vehicle 100 can be interconnected and/or in communication. Thus, one or more of the functions of the vehicle 100 described herein can optionally be divided between additional functional or physical components, or combined into fewer functional or physical components. In some further examples, additional functional and/or physical components may be added to the examples illustrated by FIG. 1.

The propulsion system 102 can include components operable to provide powered motion to the vehicle 100. In some embodiments the propulsion system 102 includes an engine/motor 118, an energy source 119, a transmission 120, and wheels/tires 121. The engine/motor 118 converts energy source 119 to mechanical energy. In some embodiments, the propulsion system 102 can optionally include one or both of engines and/or motors. For example, a gas-electric hybrid vehicle can include both a gasoline/diesel engine and an electric motor.

The energy source 119 represents a source of energy, such as electrical and/or chemical energy, that may, in full or in part, power the engine/motor 118. That is, the engine/motor 118 can be configured to convert the energy source 119 to mechanical energy to operate the transmission. In some embodiments, the energy source 119 can include gasoline, diesel, other petroleum-based fuels, propane, other compressed gas-based fuels, ethanol, solar panels, batteries, capacitors, flywheels, regenerative braking systems, and/or other sources of electrical power, etc. The energy source 119 can also provide energy for other systems of the vehicle 100.

The transmission 120 includes appropriate gears and/or mechanical elements suitable to convey the mechanical power from the engine/motor 118 to the wheels/tires 121. In some embodiments, the transmission 120 includes a gearbox, a clutch, a differential, a drive shaft, and/or axle(s), etc.

The wheels/tires 121 are arranged to stably support the vehicle 100 while providing frictional traction with a surface, such as a road, upon which the vehicle 100 moves. Accordingly, the wheels/tires 121 are configured and arranged according to the nature of the vehicle 100. For example, the wheels/tires can be arranged as a unicycle, bicycle, motorcycle, tricycle, or car/truck four-wheel format. Other wheel/tire geometries are possible, such as those including six or more wheels. Any combination of the wheels/tires 121 of vehicle 100 may be operable to rotate differentially with respect to other wheels/tires 121. The wheels/tires 121 can optionally include at least one wheel that is rigidly attached to the transmission 120 and at least one tire coupled to a rim of a corresponding wheel that makes contact with a driving surface. The wheels/tires 121 may include any combination of metal and rubber, and/or other materials or combination of materials.

The sensor system 104 generally includes one or more sensors configured to detect information about the environment surrounding the vehicle 100. For example, the sensor system 104 can include a Global Positioning System (GPS) 122, an inertial measurement unit (IMU) 124, a RADAR unit 126, a laser rangefinder/LIDAR unit 128, a camera 130, and/or a microphone 131. The sensor system 104 could also include sensors configured to monitor internal systems of the vehicle 100 (e.g., $O_2$ monitor, fuel gauge, engine oil temperature, wheel speed sensors, etc.). One or more of the sensors included in sensor system 104 could be configured to be actuated separately and/or collectively in order to modify a position and/or an orientation of the one or more sensors.

The GPS 122 is a sensor configured to estimate a geographic location of the vehicle 100. To this end, GPS 122 can include a transceiver operable to provide information regarding the position of the vehicle 100 with respect to the Earth.

The IMU 124 can include any combination of sensors (e.g., accelerometers and gyroscopes) configured to sense position and orientation changes of the vehicle 100 based on inertial acceleration.

The RADAR unit 126 can represent a system that utilizes radio signals to sense objects within the local environment of the vehicle 100. In some embodiments, in addition to sensing the objects, the RADAR unit 126 and/or the computer system 112 can additionally be configured to sense the speed and/or heading of the objects.

Similarly, the laser rangefinder or LIDAR unit 128 can be any sensor configured to sense objects in the environment in which the vehicle 100 is located using lasers. The laser rangefinder/LIDAR unit 128 can include one or more laser sources, a laser scanner, and one or more detectors, among other system components. The laser rangefinder/LIDAR unit 128 can be configured to operate in a coherent (e.g., using heterodyne detection) or an incoherent detection mode.

The camera 130 can include one or more devices configured to capture a plurality of images of the environment surrounding the vehicle 100. The camera 130 can be a still camera or a video camera. In some embodiments, the camera 130 can be mechanically movable such as by rotating and/or tilting a platform to which the camera is mounted. As such, a control process of vehicle 100 may be implemented to control the movement of camera 130.

The sensor system 104 can also include a microphone 131. The microphone 131 can be configured to capture sound from the environment surrounding vehicle 100. In some cases, multiple microphones can be arranged as a microphone array, or possibly as multiple microphone arrays.

The control system 106 is configured to control operation(s) regulating acceleration of the vehicle 100 and its components. To effect acceleration, the control system 106 includes a steering unit 132, throttle 134, brake unit 136, a sensor fusion algorithm 138, a computer vision system 140, a navigation/pathing system 142, and/or an obstacle avoidance system 144, etc.

The steering unit 132 is operable to adjust the heading of vehicle 100. For example, the steering unit can adjust the axis (or axes) of one or more of the wheels/tires 121 so as to effect turning of the vehicle. The throttle 134 is configured to control, for instance, the operating speed of the engine/motor 118 and, in turn, adjust forward acceleration of the vehicle 100 via the transmission 120 and wheels/tires 121. The brake unit 136 decelerates the vehicle 100. The brake unit 136 can use friction to slow the wheels/tires 121. In some embodiments, the brake unit 136 inductively decelerates the wheels/tires 121 by a regenerative braking process to convert kinetic energy of the wheels/tires 121 to electric current.

The sensor fusion algorithm 138 is an algorithm (or a computer program product storing an algorithm) configured to accept data from the sensor system 104 as an input. The data may include, for example, data representing information sensed at the sensors of the sensor system 104. The sensor fusion algorithm 138 can include, for example, a Kalman filter, Bayesian network, etc. The sensor fusion algorithm 138 provides assessments regarding the environment surrounding the vehicle based on the data from sensor system 104. In some embodiments, the assessments can include evaluations of individual objects and/or features in the environment surrounding vehicle 100, evaluations of particular situations, and/or evaluations of possible interference between the vehicle 100 and features in the environment (e.g., such as predicting collisions and/or impacts) based on the particular situations.

The computer vision system 140 can process and analyze images captured by camera 130 to identify objects and/or features in the environment surrounding vehicle 100. The detected features/objects can include traffic signals, road way boundaries, other vehicles, pedestrians, and/or obstacles, etc. The computer vision system 140 can optionally employ an object recognition algorithm, a Structure From Motion (SFM) algorithm, video tracking, and/or available computer vision techniques to effect categorization and/or identification of detected features/objects. In some embodiments, the computer vision system 140 can be additionally configured to map the environment, track perceived objects, estimate the speed of objects, etc.

The navigation and pathing system 142 is configured to determine a driving path for the vehicle 100. For example, the navigation and pathing system 142 can determine a series of speeds and directional headings to effect movement of the vehicle along a path that substantially avoids perceived obstacles while generally advancing the vehicle along a roadway-based path leading to an ultimate destination, which can be set according to user inputs via the user interface 116, for example. The navigation and pathing system 142 can additionally be configured to update the driving path dynamically while the vehicle 100 is in operation on the basis of perceived obstacles, traffic patterns, weather/road conditions, etc. In some embodiments, the navigation and pathing system 142 can be configured to incorporate data from the sensor fusion algorithm 138, the GPS 122, and one or more predetermined maps so as to determine the driving path for vehicle 100.

The obstacle avoidance system 144 can represent a control system configured to identify, evaluate, and avoid or otherwise negotiate potential obstacles in the environment surrounding the vehicle 100. For example, the obstacle avoidance system 144 can effect changes in the navigation of the vehicle by operating one or more subsystems in the control system 106 to undertake swerving maneuvers, turning maneuvers, braking maneuvers, etc. In some embodiments, the obstacle avoidance system 144 is configured to automatically determine feasible ("available") obstacle avoidance maneuvers on the basis of surrounding traffic patterns, road conditions, etc. For example, the obstacle avoidance system 144 can be configured such that a swerving maneuver is not undertaken when other sensor systems detect vehicles, construction barriers, other obstacles, etc. in the region adjacent the vehicle that would be swerved into. In some embodiments, the obstacle avoidance system 144 can automatically select the maneuver that is both available and maximizes safety of occupants of the vehicle. For example, the obstacle avoidance system 144 can select an avoidance maneuver predicted to cause the least amount of acceleration in a passenger cabin of the vehicle 100.

The vehicle 100 also includes peripherals 108 configured to allow interaction between the vehicle 100 and external sensors, other vehicles, other computer systems, and/or a user, such as an occupant of the vehicle 100. For example, the peripherals 108 for receiving information from occupants, external systems, etc. can include a wireless communication system 146, a touchscreen 148, a microphone 150, and/or a speaker 152.

In some embodiments, the peripherals 108 function to receive inputs for a user of the vehicle 100 to interact with the user interface 116. To this end, the touchscreen 148 can both provide information to a user of vehicle 100, and convey information from the user indicated via the touchscreen 148 to the user interface 116. The touchscreen 148 can be configured to sense both touch positions and touch gestures from a user's finger (or stylus, etc.) via capacitive sensing, resistance sensing, optical sensing, a surface acoustic wave process, etc. The touchscreen 148 can be capable of sensing finger movement in a direction parallel or planar to the touchscreen surface, in a direction normal to the touchscreen surface, or both, and may also be capable of sensing a level of pressure applied to the touchscreen surface. An occupant of the vehicle 100 can also utilize a voice command interface. For example, the microphone 150 can be configured to receive audio (e.g., a voice command or other audio input) from a user of the vehicle 100. Similarly, the speakers 152 can be configured to output audio to the user of the vehicle 100.

In some embodiments, the peripherals 108 function to allow communication between the vehicle 100 and external systems, such as devices, sensors, other vehicles, etc. within its surrounding environment and/or controllers, servers, etc., physically located far from the vehicle that provide useful information regarding the vehicle's surroundings, such as traffic information, weather information, etc. For example, the wireless communication system 146 can wirelessly communicate with one or more devices directly or via a communication network. The wireless communication system 146 can optionally use 3G cellular communication, such as CDMA, EVDO, GSM/GPRS, and/or 4G cellular communication, such as WiMAX or LTE. Additionally or alternatively, wireless communication system 146 can communicate with a wireless local area network (WLAN), for example, using WiFi. In some embodiments, wireless communication system 146 could communicate directly with a device, for example, using an infrared link, Bluetooth, and/or ZigBee. The wireless communication system 146 can include one or more dedicated short range communication (DSRC) devices that can include public and/or private data communications between vehicles and/or roadside stations. Other wireless protocols for sending and receiving information embedded in signals, such as various vehicular communication systems, can also be employed by the wireless communication system 146 within the context of the present disclosure.

As noted above, the power supply 110 can provide power to components of vehicle 100, such as electronics in the peripherals 108, computer system 112, sensor system 104, etc. The power supply 110 can include a rechargeable lithium-ion or lead-acid battery for storing and discharging electrical energy to the various powered components, for example. In some embodiments, one or more banks of batteries can be configured to provide electrical power. In some embodiments, the power supply 110 and energy source 119 can be implemented together, as in some all-electric cars.

Many or all of the functions of vehicle 100 can be controlled via computer system 112 that receives inputs from the sensor system 104, peripherals 108, etc., and communicates appropriate control signals to the propulsion system 102, control system 106, peripherals, etc. to effect automatic operation of the vehicle 100 based on its surroundings. Computer system 112 includes at least one processor 113 (which can include at least one microprocessor) that executes instructions 115 stored in a non-transitory computer readable medium, such as the data storage 114. The computer system 112 may also represent a plurality of computing devices that serve to control individual components or subsystems of the vehicle 100 in a distributed fashion.

In some embodiments, data storage 114 contains instructions 115 (e.g., program logic) executable by the processor 113 to execute various functions of vehicle 100, including those described above in connection with FIG. 1. Data storage 114 may contain additional instructions as well, including instructions to transmit data to, receive data from, interact with, and/or control one or more of the propulsion system 102, the sensor system 104, the control system 106, and the peripherals 108.

In addition to the instructions 115, the data storage 114 may store data such as roadway maps, path information, among other information. Such information may be used by vehicle 100 and computer system 112 during operation of the vehicle 100 in the autonomous, semi-autonomous, and/or manual modes to select available roadways to an ultimate destination, interpret information from the sensor system 104, etc.

The vehicle 100, and associated computer system 112, provides information to and/or receives input from, a user of vehicle 100, such as an occupant in a passenger cabin of the vehicle 100. The user interface 116 can accordingly include one or more input/output devices within the set of peripherals 108, such as the wireless communication system 146, the touchscreen 148, the microphone 150, and/or the speaker 152 to allow communication between the computer system 112 and a vehicle occupant.

The computer system 112 controls the operation of the vehicle 100 based on inputs received from various subsystems indicating vehicle and/or environmental conditions (e.g., propulsion system 102, sensor system 104, and/or control system 106), as well as inputs from the user interface 116, indicating user preferences. For example, the computer system 112 can utilize input from the control system 106 to control the steering unit 132 to avoid an obstacle detected by the sensor system 104 and the obstacle avoidance system 144. The computer system 112 can be configured to control many aspects of the vehicle 100 and its subsystems. Generally, however, provisions are made for manually overriding automated controller-driven operation, such as in the event of an emergency, or merely in response to a user-activated override, etc.

The components of vehicle 100 described herein can be configured to work in an interconnected fashion with other components within or outside their respective systems. For example, the camera 130 can capture a plurality of images that represent information about an environment of the vehicle 100 while operating in an autonomous mode. The environment may include other vehicles, traffic lights, traffic signs, road markers, pedestrians, etc. The computer vision system 140 can categorize and/or recognize various aspects in the environment in concert with the sensor fusion algorithm 138, the computer system 112, etc. based on object recognition models pre-stored in data storage 114, and/or by other techniques.

Although the vehicle 100 is described and shown in FIG. 1 as having various components of vehicle 100, e.g., wireless communication system 146, computer system 112, data storage 114, and user interface 116, integrated into the vehicle 100, one or more of these components can optionally be mounted or associated separately from the vehicle 100. For example, data storage 114 can exist, in part or in full, separate from the vehicle 100, such as in a cloud-based server, for example. Thus, one or more of the functional elements of the vehicle 100 can be implemented in the form of device elements located separately or together. The functional device elements that make up vehicle 100 can generally be communicatively coupled together in a wired and/or wireless fashion.

Figure 2:
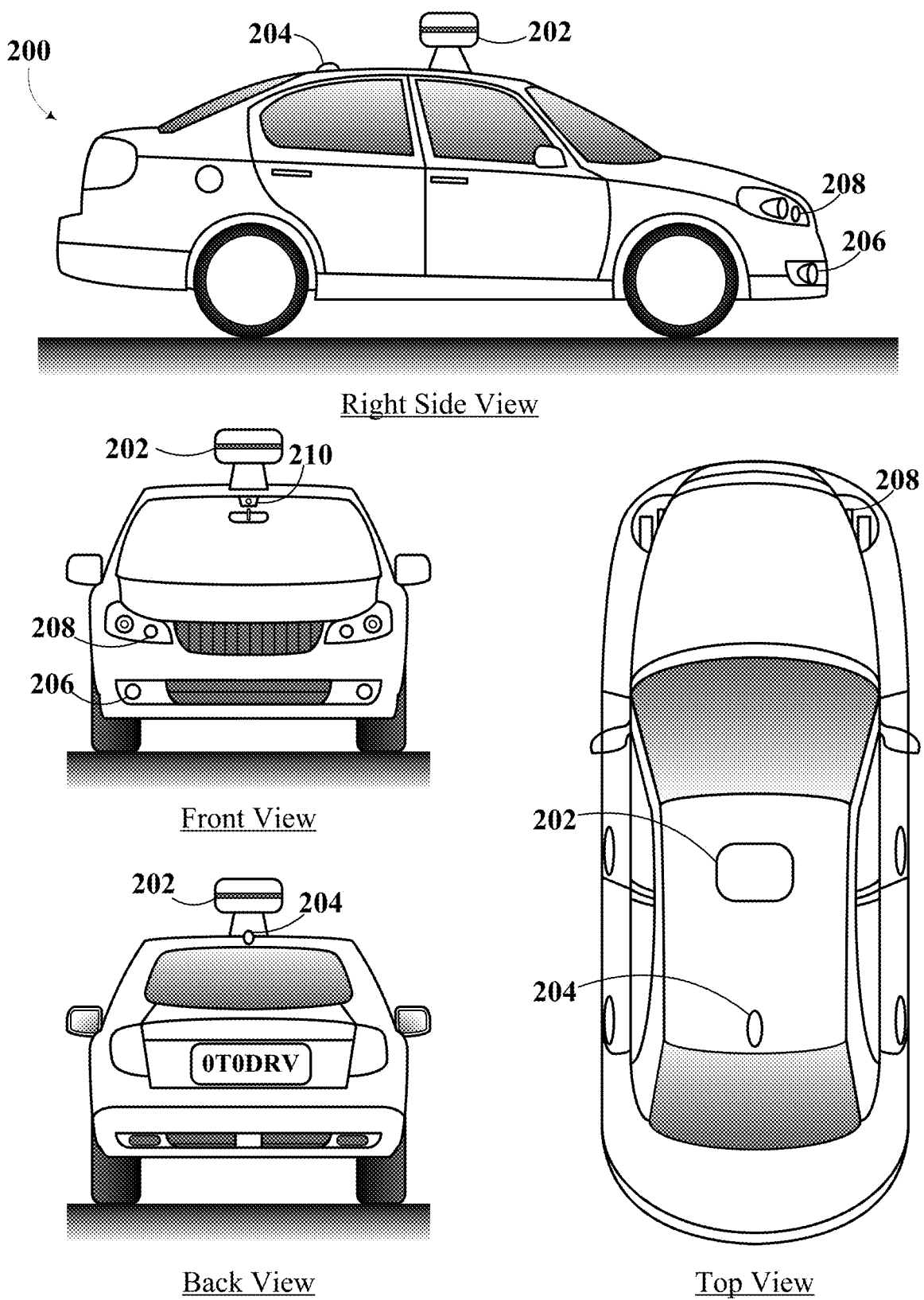
FIG. 2 depicts exterior views of an example autonomous vehicle.

FIG. 2 shows an example vehicle 200 that can include some or all of the functions described in connection with vehicle 100 in reference to FIG. 1. Although vehicle 200 is illustrated in FIG. 2 as a four-wheel sedan-type car for illustrative purposes, the present disclosure is not so limited. For instance, the vehicle 200 can represent a truck, a van, a semi-trailer truck, a motorcycle, a golf cart, an off-road vehicle, or a farm vehicle, etc.

The example vehicle 200 includes a sensor unit 202, a wireless communication system 204, a RADAR unit 206, a laser rangefinder unit 208, and a camera 210. Furthermore, the example vehicle 200 can include any of the components described in connection with vehicle 100 of FIG. 1. The RADAR unit 206 and/or laser rangefinder unit 208 can actively scan the surrounding environment for the presence of potential obstacles and can be similar to the RADAR unit 126 and/or laser rangefinder/LIDAR unit 128 in the vehicle 100.

The sensor unit 202 is mounted atop the vehicle 200 and includes one or more sensors configured to detect information about an environment surrounding the vehicle 200, and output indications of the information. For example, sensor unit 202 can include any combination of cameras, RADARs, LIDARs, range finders, and acoustic sensors. The sensor unit 202 can include one or more movable mounts that could be operable to adjust the orientation of one or more sensors in the sensor unit 202. In one embodiment, the movable mount could include a rotating platform that could scan sensors so as to obtain information from each direction around the vehicle 200. In another embodiment, the movable mount of the sensor unit 202 could be moveable in a scanning fashion within a particular range of angles and/or azimuths. The sensor unit 202 could be mounted atop the roof of a car, for instance, however other mounting locations are possible. Additionally, the sensors of sensor unit 202 could be distributed in different locations and need not be collocated in a single location. Some possible sensor types and mounting locations include RADAR unit 206 and laser rangefinder unit 208. Furthermore, each sensor of sensor unit 202 can be configured to be moved or scanned independently of other sensors of sensor unit 202.

In an example configuration, one or more RADAR scanners (e.g., the RADAR unit 206) can be located near the front of the vehicle 200, to actively scan the region in front of the car 200 for the presence of radio-reflective objects. A RADAR scanner can be situated, for example, in a location suitable to illuminate a region including a forward-moving path of the vehicle 200 without occlusion by other features of the vehicle 200. For example, a RADAR scanner can be situated to be embedded and/or mounted in or near the front bumper, front headlights, cowl, and/or hood, etc. Furthermore, one or more additional RADAR scanning devices can be located to actively scan the side and/or rear of the vehicle 200 for the presence of radio-reflective objects, such as by including such devices in or near the rear bumper, side panels, rocker panels, and/or undercarriage, etc.

The wireless communication system 204 could be located on a roof of the vehicle 200 as depicted in FIG. 2. Alternatively, the wireless communication system 204 could be located, fully or in part, elsewhere. The wireless communication system 204 may include wireless transmitters and receivers that could be configured to communicate with devices external or internal to the vehicle 200. Specifically, the wireless communication system 204 could include transceivers configured to communicate with other vehicles and/or computing devices, for instance, in a vehicular communication system or a roadway station. Examples of such vehicular communication systems include dedicated short range communications (DSRC), radio frequency identification (RFID), and other proposed communication standards directed towards intelligent transport systems.

The camera 210 can be a photo-sensitive instrument, such as a still camera, a video camera, etc., that is configured to capture a plurality of images of the environment of the vehicle 200. To this end, the camera 210 can be configured to detect visible light, and can additionally or alternatively be configured to detect light from other portions of the spectrum, such as infrared or ultraviolet light. The camera 210 can be a two-dimensional detector, and can optionally have a three-dimensional spatial range of sensitivity. In some embodiments, the camera 210 can include, for example, a range detector configured to generate a two-dimensional image indicating distance from the camera 210 to a number of points in the environment. To this end, the camera 210 may use one or more range detecting techniques.

For example, the camera 210 can provide range information by using a structured light technique in which the vehicle 200 illuminates an object in the environment with a predetermined light pattern, such as a grid or checkerboard pattern and uses the camera 210 to detect a reflection of the predetermined light pattern from environmental surroundings. Based on distortions in the reflected light pattern, the vehicle 200 can determine the distance to the points on the object. The predetermined light pattern may comprise infrared light, or radiation at other suitable wavelengths for such measurements.

The camera 210 can be mounted inside a front windshield of the vehicle 200. Specifically, the camera 210 can be situated to capture images from a forward-looking view with respect to the orientation of the vehicle 200. Other mounting locations and viewing angles of camera 210 can also be used, either inside or outside the vehicle 200.

The camera 210 can have associated optics operable to provide an adjustable field of view. Further, the camera 210 can be mounted to vehicle 200 with a movable mount to vary a pointing angle of the camera 210, such as via a pan/tilt mechanism.

III. Example LIDAR Device

An example light detection and ranging (LIDAR) device operates to estimate positions of reflective objects surrounding the device by illuminating its surrounding environment with pulses of light and measuring the reflected signals. An example LIDAR device may include a light source, beam-steering optics, a light sensor, and a controller. The light source may emit pulses of light toward the beam-steering optics, which directs the pulses of light across a scanning zone. Reflective features in the scanning zone reflect the emitted pulses of light and the reflected light signals can be detected by the light sensor. The controller can regulate the operation of the light source and beam-steering optics to scan pulses of light across the scanning zone. The controller can also be configured to estimate positions of reflective features in the scanning zone based on the reflected signals detected by the light sensor. For example, the controller can measure the time delay between emission of a pulse of light and reception of a reflected light signal and determine the distance to the reflective feature based on the time of flight of a round trip to the reflective feature. In addition, the controller may use the orientation of the beam-steering optics at the time the pulse of light is emitted to estimate a direction toward the reflective feature. The estimated direction and estimated distance can then be combined to estimate a three-dimensional position of the reflective object relative to the LIDAR device.

Figure 3A:
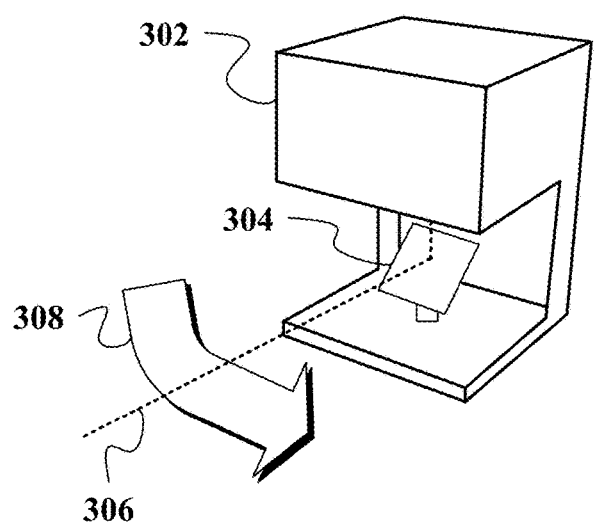
FIG. 3A provides an example depiction of a LIDAR device including beam steering optics.

FIG. 3A provides an example depiction of a LIDAR device 302 including beam steering optics 304. A laser beam 306 is directed to the beam steering optics 304. In the example illustrated in FIG. 3A, the beam steering optics 304 is a rotating angled mirror that directs the laser beam 306 to sweep across a scanning zone. The beam steering optics 304 may include a combination of lenses, mirrors, and/or apertures configured to direct the laser beam to sweep across a scanning zone, and are interchangeably described as the rotating angled mirror 304. The rotating angled mirror 304 rotates about an axis substantially parallel, and roughly in line with, the initial downward path of the laser beam 306. The rotating angled mirror 304 rotates in the direction indicated by the reference arrow 308 in FIG. 3A.

Although rangefinder 302 is depicted as having an approximately 180 degree range of rotation for the scanning zone of the laser beam 306 via the rotating angled mirror 304, this is for purposes of example and explanation only. LIDAR 302 can be configured to have viewing angles (e.g., angular range of available orientations during each sweep), including viewing angles up to and including 360 degrees. Further, although LIDAR 302 is depicted with the single laser beam 306 and a single mirror 304, this is for purposes of example and explanation only, LIDAR 302 can include multiple laser beams operating simultaneously or sequentially to provide greater sampling coverage of the surrounding environment. The LIDAR 302 also includes, or works in concert with, additional optical sensors (e.g., a photo-detector, not shown) configured to detect the reflection of laser beam 306 from features/objects in the surrounding environment with sufficient temporal sensitivity to determine distances to the reflective features. For example, with reference to the vehicle 200 in FIG. 2, such optical sensors can optionally be co-located with the top-mounted sensors 204 on the autonomous vehicle 200.

Figure 3B:
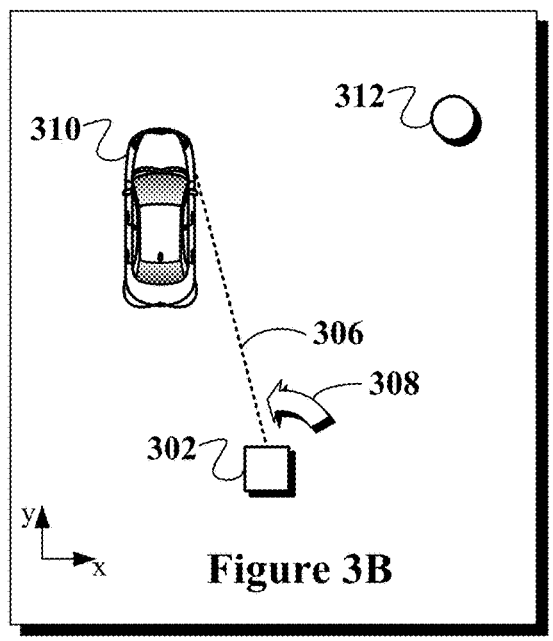
FIG. 3B symbolically illustrates an example in which a LIDAR device scans across an obstacle-filled environmental scene.

FIG. 3B symbolically illustrates the LIDAR device 302 scanning across an obstacle-filled environmental scene. The example vehicular environment depicted in FIG. 3B includes a car 310 and a tree 312. In operation, LIDAR 302 rotates according to motion reference arrow 308. While rotating, the LIDAR 302 regularly (e.g., periodically) emits laser pulses, such as the laser pulse 306. Objects in the surrounding environment, such as vehicle 310 and tree 312, reflect the emitted pulses and the resulting reflected signals are then received by suitable sensors. Precisely time-stamping the receipt of the reflected signals allows for associating each reflected signal (if any is received at all) with the most recently emitted laser pulse, and measuring the time delay between emission of the laser pulse and reception of the reflected light. The time delay provides an estimate of the distance to the reflective feature by scaling according to the speed of light in the intervening atmosphere. Combining the distance information for each reflected signal with the orientation of the LIDAR device 302 for the respective pulse emission allows for determining a position of the reflective feature in three-dimensions. For illustrative purposes, the environmental scene in FIG. 3B is described in the two-dimensional x-y plane in connection with a single sweep of the LIDAR device 302 that estimates positions to a series of points located in the x-y plane. However, it is noted that a more complete three-dimensional sampling is provided by either adjusting the beam steering optics 304 to direct the laser beam 306 up or down from the x-y plane on its next sweep of the scene or by providing additional lasers and associated beam steering optics dedicated to sampling point locations in planes above and below the x-y plane shown in FIG. 3B, or combinations of these techniques.

Figure 3C:
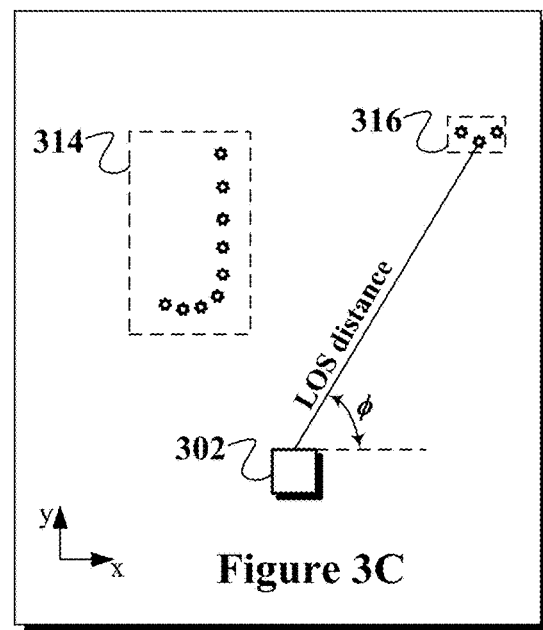
FIG. 3C symbolically illustrates an example point cloud corresponding to the obstacle-filled environmental scene of FIG. 3B.

FIG. 3C symbolically illustrates a point cloud corresponding to the obstacle-filled environmental scene of FIG. 3B. Spatial-point data (represented by stars) are shown from a ground-plane (or aerial) perspective. Even though the individual points are not equally spatially distributed throughout the sampled environment, adjacent sampled points are roughly equally angularly spaced with respect to the LIDAR device 302. A cluster of points referred to herein as car spatial data 314 corresponds to measured points on the surface of the car 310 with a line of sight to the LIDAR device 302. Similarly, a cluster of points referred to herein as tree spatial data 316 corresponds to measured points on the surface of the tree 312 visible from the LIDAR device 302. The absence of points between the car spatial data 314 and the tree spatial data 316 indicates an absence of reflective features along the sampled line of sight paths in the plane illustrated.

Each point in the example point cloud illustrated symbolically in FIG. 3C can be referenced by an azimuth angle $\phi$ (e.g. orientation of the LIDAR device 302 while emitting the pulse corresponding to the point, which is determined by the orientation of the rotating angled mirror 304) and a line-of-sight (LOS) distance (e.g., the distance indicated by the time delay between pulse emission and reflected light reception). For emitted pulses that do not receive a reflected signal, the LOS distance can optionally be set to the maximum distance sensitivity of the LIDAR device 302. The maximum distance sensitivity can be determined according to the maximum time delay the associated optical sensors wait for a return reflected signal following each pulse emission, which can itself be set according to the anticipated signal strength of a reflected signal at a particular distance given ambient lighting conditions, intensity of the emitted pulse, predicted reflectivity of environmental features, etc. In some examples, the maximum distance can be approximately 60 meters, 80 meters, 100 meters, or 150 meters, but other examples are possible for particular configurations of the LIDAR device 302 and associated optical sensors.

In some embodiments, the sensor fusion algorithm 138, computer vision system 140, and/or computer system 112, can interpret the car spatial data 314 alone and/or in combination with additional sensor-indicated information and/or memory-based pattern-matching point clouds and/or baseline maps of the environment to categorize or identify the group of points 314 as corresponding to the car 310. Similarly, the tree spatial data 316 can identified as corresponding to the tree 310 in accordance with a suitable object-detection technique. As described further herein, some embodiments of the present disclosure provide for identifying a region of the point cloud for study with enhanced resolution scanning technique on the basis of the already-sampled spatial-points.

Figure 4B:
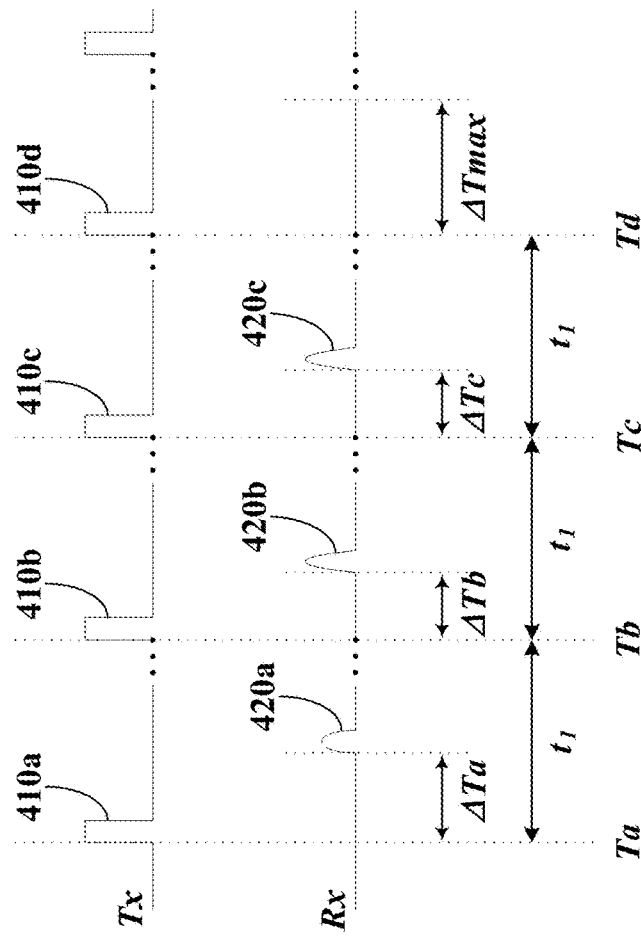
FIG. 4B is an example timing diagram of transmitted and received pulses for the symbolic illustration of FIG. 4A.
Figure 4A:
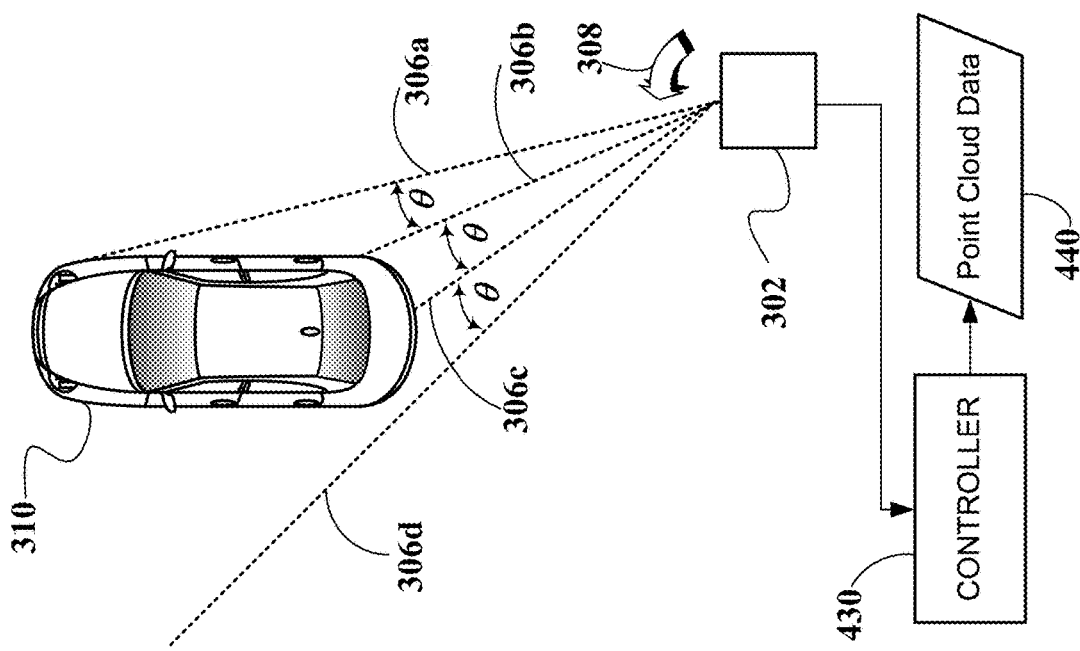
FIG. 4A symbolically illustrates a LIDAR device scanning across an example obstacle-filled environmental scene and using reflected signals to generate a point cloud.

FIG. 4A symbolically illustrates a LIDAR device 302 scanning across an example obstacle-filled environmental scene. The LIDAR device 302 scans the laser beam 306 across the environmental scene via its beam steering optics 304 while its laser light source pulses, such that successive pulses are emitted with an angular separation $\theta_1$. Successive pulses are emitted periodically with a temporal separation $t_1$. For illustrative purposes, the angular separation $\theta_1$ between adjacent, successively emitted pulses is exaggerated in FIG. 4A to allow individual pulses to be represented in the drawing. As a result of the rotation of the beam steering optics in the LIDAR device 302, temporally separated pulses (e.g., pulses emitted at times separated by the time $t_1$) are directed in respective angular orientations separated by the amount of rotation of the beam steering optics during the interval $t_1$, (e.g., the angle $\theta_1$). A controller 430 is arranged to receive signals from the LIDAR device 302 and/or associated optical sensors to generate point cloud data 440 indicative of the 3-D positions of reflective features in the environmental scene surrounding the LIDAR device 302.

FIG. 4B is a timing diagram of the transmitted and received pulses for the exaggerated symbolic illustration of FIG. 4A. The timing diagram symbolically illustrates the transmitted pulses (labeled on FIG. 4B as "Tx") and the corresponding received pulses (labeled on FIG. 4B as "Rx").

An example operation of the LIDAR device 302 is described in connection with FIGS. 4A and 4B. At time Ta, a first pulse 410a is emitted from the LIDAR device 302 and directed along laser beam path 306a via the beam steering optics. As shown in FIG. 4A, the beam path 306a is reflected from near the front passenger-side region of the car 310, and a first reflected signal 420a is detected at optical signals associated with the LIDAR device 302 (e.g., via optical sensors included in the sensor system 202 mounted on the vehicle 200 in FIG. 2). The time delay between the emission of pulse 410a and reception of the reflected signal 420a is indicated by time delay ΔTa. The time delay ΔTa and the orientation of the LIDAR device 302 at time Ta, i.e., the direction of laser beam 306a, are combined in the controller 430 to map the 3-D position of the reflective point on the front passenger-side region of the car 310.

Next, at time Tb, a second pulse 410b is emitted from the LIDAR device 302 and directed along laser beam path 306b. Time Tb is temporally separated from time Ta by the interval time t1, and the direction of the laser beam path 306b is angularly separated from the direction of laser beam path 306a by angular separation $\theta_1$, due to the change in orientation of the beam steering optics in the LIDAR device during the interval $t_1$. The laser pulse 310b is reflected from near the rear passenger-side region of the car 310, and a second reflected signal 420b is detected with a relative time delay ΔTb from the emission of the second pulse 410b. As illustrated in FIG. 4B, the LIDAR device 302 is generally situated behind the car 310, and so the reflective point near the rear passenger-side region of the car 310 (responsible for the reflected signal 420b) is closer to the LIDAR device 302 than the reflective point near the front passenger-side region of the car 310 (responsible for the reflected signal 420a). As a result, the relative time delay ΔTb is shorter than the relative time delay ΔTa, corresponding to the difference in roundtrip travel time at the speed of light between the LIDAR device 302, and the respective reflective points at the front and rear of the car.

Further, the sensors detecting the reflected signals can optionally be sensitive to the intensity of the reflected signals. For example, the intensity of the reflected signal 420b can be perceptibly greater than the intensity of the reflected signal 420a, as shown symbolically in FIG. 4B. The controller 430 maps the 3-D position of the reflective point near the rear passenger-side of the car 310 according to the time delay value ΔTb and the orientation of the LIDAR device 310 at time Tb, i.e., the direction of laser beam 306b. The intensity of the reflected signal can also indicate the reflectance of the reflective point, in combination with the distance to the point as indicated by the measured time delay. The reflectance of the reflective point can be employed by software and/or hardware implemented modules in the controller 430 to characterize the reflective features in the environment. For example, traffic indicators such as lane markers, traffic signs, traffic signals, navigational signage, etc., can be indicated in part based on having a relatively high reflectance value, such as associated with a reflective coating applied to traffic and/or navigational signage. In some embodiments, identifying a relatively high reflectance feature can provide a prompt to undertake a further scan of the high reflectance feature with one or more sensors, such as those in the sensing system 104. Thus, in one example, a reflected signal indicating a high reflectance feature can provide a prompt to image the high reflectance feature with a camera to allow for identifying the high reflectance feature. In some embodiments where the high reflectance feature is a traffic sign, the camera image can allow for reading the sign via character recognition and/or pattern matching, etc. and then optionally adjusting navigational instructions based on the sign (e.g., a sign indicating a construction zone, pedestrian crosswalk, school zone, etc. can prompt the autonomous vehicle to reduce speed).

At time Tc, following the time Tb by the interval t1, a third pulse 410c is emitted from the LIDAR device 302. The third pulse 410c is directed along a laser beam path 306c, which is approximately angularly separated from the beam path 306b by the angle $\theta_1$. The pulse 410c is reflected from a point near the middle of the rear bumper region of the car 310, and a resulting reflected signal 420c is detected at the LIDAR device 302 (or its associated optical sensors). The controller 430 combines the relative time delay ΔTc between the emission of pulse 410c and reception of reflected signal 420c and the orientation of the LIDAR device 302 at time Tc, i.e., the direction of beam path 306c, to map the 3-D position of the reflective point.

At time Td, following time Tc by the interval $t_1$, a fourth pulse 410d is emitted from the LIDAR device 302. The fourth pulse 410d is directed along a laser beam path 306d, which is approximately angularly separated from the beam path 306c by the angle $\theta_1$. The beam path 306d entirely avoids the car 310, and all other reflective environmental features within a maximum distance sensitivity of the LIDAR device 302. As discussed above, the maximum distance sensitivity of the LIDAR device 302 is determined by the sensitivity of the associated optical sensors for detecting reflected signals. The maximum relative time delay ΔTmax corresponds to the maximum distance sensitivity of the LIDAR device (i.e., the time for light signals to make a round trip of the maximum distance). Thus, when the optical sensor associated with the LIDAR device 302 does not receive a reflected signal in the period ΔTmax following time Td, the controller 430 determines that no reflective features are present in the surrounding environment along the laser beam path 306d.

The reflective points on the car 310 corresponding to the reflected signals 420a-c form a subset of points included in a 3-D point cloud map 440 of the environment surrounding the LIDAR device 302. In addition, the direction of the laser beam 310d is noted in the 3-D point cloud map 440 as being absent of reflective features along the line of sight within the maximum distance sensitivity of the LIDAR device 302, because no reflected signal was received after the duration ΔTmax following the emission of pulse 410d at time Td. The points corresponding to laser beam directions 306a-d are combined with points spaced throughout the scanning zone (e.g., the region scanned by the LIDAR device 302), to create a complete 3-D point cloud map, and the results are output as fixed resolution point cloud data 440 for further analysis by object detection systems, pattern recognition systems, computer vision systems, etc.

IV. Example Laser Diode Firing Circuit

In order to illuminate a scanning zone with pulses of light, a LIDAR device includes one or more light sources that are triggered to emit pulses of light. The light sources may include light emitting elements such as a laser diode or another emissive light source. A laser diode is a semiconductor device including a p-n junction with an active region in which oppositely polarized, energized charge carriers (e.g., free electrons and/or holes) recombine while current flows through the device across the p-n junction. The recombination results in emission of light due to a change in energy state of the charge carriers. When the active region is heavily populated by such energized pairs (e.g., the active region may have a population inversion of energized states), stimulated emission across the active region may produce a substantially coherent wave front of light that is then emitted from the laser diode. Recombination events, and the resulting light emission, occur in response to current flowing through the device, and so applying a pulse of current to the laser diode results in emission of a pulse of light from the laser diode.

In some examples, firing circuits described herein may include laser diodes configured to emit pulses of light in the visible spectrum, the ultraviolet spectrum, the near-infrared spectrum, and/or the infrared spectrum. In one example, a laser diode emits infrared light with a wavelength of about 905 nanometers.

To achieve a given spatial resolution using the LIDAR system, both the emission time (when light pulses are emitted from the LIDAR device) and the reception time (when reflected portions of the pulses return from a round trip after being reflected by an object in the surrounding environment) are determined with a particular degree of accuracy. Determinations of the emission time and reception time are influenced by several factors such as the temporal responsiveness of the transmitting and receiving electronics and also the temporal profile of the pulse itself, because a pulse with a sharply defined leading edge allows for a more precise determination of reception time. In some examples, turn on times (ramp up times) may be less than one nanosecond, or may be 100s of picoseconds, or may be even less than 100 picoseconds.

A light pulse with the desired temporal profile can be generated by applying a rapidly switched current to a laser diode (e.g., a current source that rapidly transitions from near zero current to a current sufficient to cause the laser diode to emit light). Circuits configured to convey such currents to laser diodes to cause the laser diodes to fire (e.g., emit a pulse of light) are referred to herein as laser diode firing circuits. One example laser diode firing circuit includes a laser diode connected in series with a transistor capable of switching large currents over brief transition times. Current through the laser diode, and thus emission from the laser diode, can then be controlled by operating the transistor. An example circuit may switch from near zero current through the laser diode, to about 30 amperes in about 2 nanoseconds, and back to near zero current again in about another 2 nanoseconds. However, such switching transistors may exhibit delays between the time an initiating signal is applied to turn on the transistor and the time that current begins flowing. In some cases, at least a portion of the delay may be due to systematic, substantially repeatable factors such as physical dimensions of the transistor, materials properties, carrier mobility, temperature and/or voltage dependence of circuit components, etc. A portion of the delay may also be a non-zero substantially random (i.e., non-repeatable) amount of jitter due to, for example, quantum effects in the transistor or other semiconductive components of the firing circuit. While systematic, repeatable timing delays may be calibrated and/or compensated, random timing jitter cannot be readily compensated due to the random timing jitter variations between each switching event. As a result, the timing of the initiating signal applied to the driving transistor may not be an accurate indicator of the pulse emission time. Moreover, such delays can lead to uncertainties in the resulting position estimation if not accounted for.

The present disclosure provides laser diode firing circuits that incorporate feedback to allow for determining the emission time of the light emitted from the laser diode. In some examples, feedback is provided by a conductive loop disposed proximate the firing circuit. The conductive loop acts as an antenna to detect changes in current flow in the firing circuit. Monitoring the leads of the conductive loop allows for detection of the pulse emission time, because a change in current in the firing circuit induces a voltage in the conductive loop.

Figure 5A:
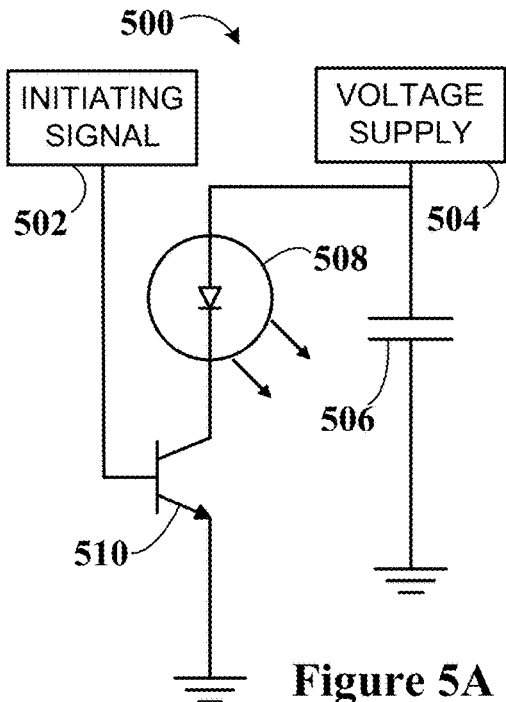
FIG. 5A is an example laser diode firing circuit.

FIG. 5A is an example laser diode firing circuit 500. The firing circuit 500 includes a capacitor 506 connected in series with a laser diode 508 and a transistor 510. The capacitor 506 has one terminal connected to a voltage supply 504 and an anode of the laser diode 508. The other terminal of the capacitor 506 can be connected to ground, or to another reference voltage sufficient to allow the capacitor 506 to be charged by the voltage supply 504. The cathode of the laser diode 508 is connected to one terminal of the transistor 510, which has another terminal connected to ground. The transistor 510 acts as a switch to selectively allow current to flow through the laser diode 508 according to the initiating signal 502. In FIG. 5A, the transistor 510 is illustrated as a bipolar junction transistor with the initiating signal 502 connected to the base terminal of the transistor 510, although it is understood the firing circuit 500 may be implemented with alternative transistors to selectively switch current through the laser diode, such as a field effect transistor, etc. Further, while the transistor 510 is illustrated as an n-type transistor, a complementary circuit may be formed using a p-type transistor.

During operation, the voltage supply 504 applies a charging voltage to the capacitor 506 while the transistor 510 is turned off (i.e., no current flows through the transistor 510 to the laser diode 508). The capacitor 506 charges to the charging voltage applied by the voltage supply 504. To emit light, the initiating signal 502 turns the transistor 510 on, which allows current to flow through the laser diode 508. While the transistor 510 is turned on, the cathode of the laser diode 508 is coupled to ground (via the transistor 510), and the capacitor 506 is connected across the laser diode 508. The capacitor 506 therefore discharges its stored charge through the laser diode 508 and the discharge current from the capacitor 506 flowing through the laser diode 508 causes the laser diode 508 to emit a pulse of light. The laser diode ceases emitting when current stops flowing through the laser diode, which occurs upon the transistor 510 being turned off by the initiating signal 502. While the transistor 510 is turned off, the capacitor 506 recharges to the voltage applied by the voltage supply 504.

Figure 5B:
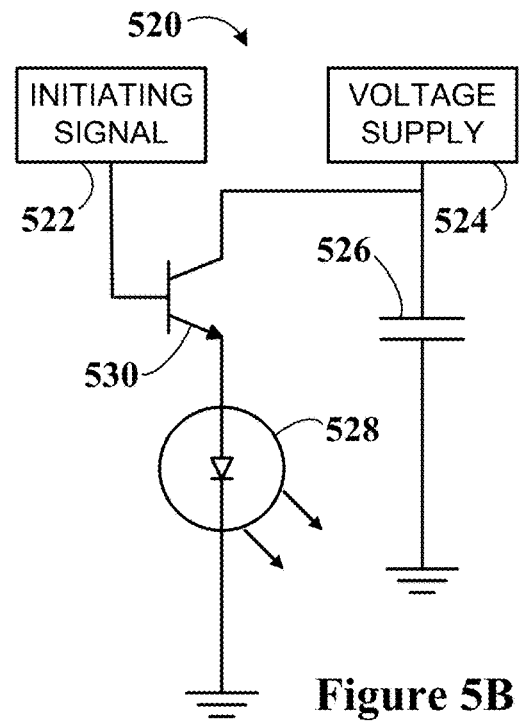
FIG. 5B is another example laser diode firing circuit.

FIG. 5B is another example laser diode firing circuit 520. The laser diode firing circuit 520 includes a capacitor 526 in series with a transistor 530 and a laser diode 528. Similar to the firing circuit 500 in FIG. 5A, the capacitor 526 is coupled between a voltage supply 524 and a ground voltage (or another reference voltage) to allow the capacitor 526 to charge from the voltage supply 524 while the transistor 530 is turned off. The transistor 530 is controlled by an initiating signal 522 to selectively connect the laser diode 528 across the capacitor 526. Thus, upon applying a suitable initiating signal to turn on the transistor 530, the charged capacitor 526 can discharge through the transistor 530 to the laser diode 528 and thereby cause the laser diode 528 to emit a pulse of light.

In the firing circuit 520, the laser diode 528 is coupled between the transistor 530 and a ground voltage (or another reference voltage), rather than between the capacitor and transistor as in the firing circuit 500 of FIG. 5A. The laser diode 528 may receive current from an emitter terminal of the transistor 528, rather than a collector terminal as in, for example, the firing circuit 500 of FIG. 5A. However, both firing circuits 500, 520 allow for a capacitor to charge from a voltage supply while the transistor is turned off and for the capacitor to discharge through the laser diode while the transistor is turned on.

Figure 5C:
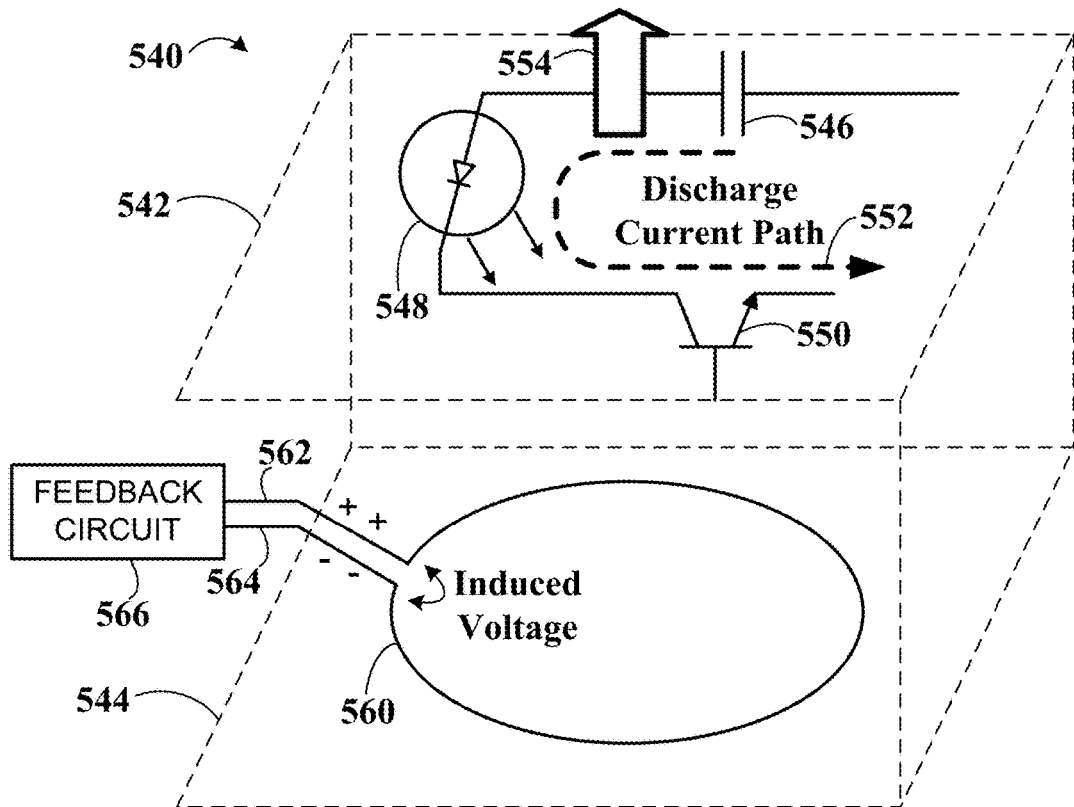
FIG. 5C shows an example laser diode firing circuit arranged to induce a signal in a feedback loop upon firing of the laser diode.

FIG. 5C shows an example laser diode firing circuit 540 positioned to induce a signal in a feedback loop 560 upon firing of the laser diode 548. The firing circuit 540 in FIG. 5C is illustrated on two separated planes 542, 544, which are shown with an exaggerated separation for convenience in explanation. The plane 542 includes a laser diode firing circuit, which may be configured similarly to either of the firing circuits 500, 520 in FIG. 5A or 5B. The firing circuit includes a laser diode 548 coupled to a capacitor 546 and a transistor 550 such that the capacitor 546 charges while the transistor 550 is turned off (e.g., via a voltage supply not shown) and discharges through the laser diode 548 while the transistor 550 is turned on. The direction of the discharge current path is shown by the dashed arrow 552.

The plane 544 can be situated in a substantially parallel plane to the plane 542 and includes the feedback loop 560. In some cases, the firing circuit in plane 542 can be situated on one side of a printed circuit board (or another substrate) and the feedback loop 560 in the plane 544 can be situated on the other side of the printed circuit board. Alternatively, the feedback loop 560 may be in an internal layer of the printed circuit board and the firing circuit may be on one side of the printed circuit board (or on both sides with vias to connect components on opposite sides). The feedback loop 560 can be formed of a conductive material arranged in loop so as to at least partially overlap the discharge current path 552 of the firing circuit. For example, the feedback loop 560 may be formed of a conductive trace with a center point approximately aligned with a center point of the discharge current path 552. The feedback loop 560 has two leads 562, 564 connected to a feedback circuit 566. The feedback circuit 566 is configured to detect an indication of an induced voltage in the feedback loop 560 (e.g., by detecting a voltage change between the leads 562, 564. The feedback loop 560 can be used to detect current flowing along the discharge current path 552 in the firing circuit (i.e., emission of a light pulse from the laser diode 548) because the discharge current 552 induces a corresponding voltage in the feedback loop 560.

Thus, the feedback loop 560 is arranged to react to changes in current in the firing circuit via inductive interactions. The inductively coupled feedback loop 560 reacts to magnetic flux generated by the discharge current 552 in the firing circuit 540. The discharge current 552 generates an upward directed magnetic flux, which is indicated by the directional arrow 554. The feedback loop 560 is positioned such that the inner portion of the feedback loop 560 overlaps the flux-generating portion(s) of the discharge current path 552 such that the generated flux at least partially passes through the feedback loop 560. Such flux (e.g., the magnetic flux 554) is generated by the discharge current path 552 along the portions of the discharge current path 552 that trace portion(s) of a closed shape (e.g., boundary of a square, circle, polygon, etc.). Accordingly, the discharge current path 552 is generally not arranged along a straight line and is instead arranged with some amount of curvature so as to generate a magnetic flux transverse to the plane 542 in which the firing circuit is situated while the discharge current flows through the laser diode 548. The generated magnetic flux 554 induces a voltage in the feedback loop 560 with an orientation given by Faraday's Law of induction. Or, as stated in Lenz's Law, the induced voltage (or electromotive force) in the feedback loop 560 is directed to give rise to a current with a magnetic field that opposes the change in magnetic flux. Thus, in the example in FIG. 5C, the induced voltage from the increase in magnetic flux 554 causes the lead 562 to be positive with respect to the lead 564.

The feedback circuit 566 can thus be used to detect the pulse emission from the laser diode 548 (i.e., the firing of the firing circuit). The feedback circuit 566 can monitor the voltage between the leads 562, 564 of the feedback loop 560. Upon detecting a change in the voltage between the two (e.g., lead 562 increased relative to lead 564 as shown in FIG. 5C), it can be determined that the firing circuit has emitted a pulse of light. For example, a controller or timing system (which may be implemented as an field programmable gate array) is configured to determine a pulse emission time based on the voltage change detected using the feedback circuit 566. In a LIDAR system with a light source equipped with a feedback loop as in FIG. 5C, the time that a change in voltage is detected between the leads of the feedback loop can therefore be used to determine the pulse emission time, and the pulse emission time can then be used in combination with a reception time of a reflected light signal to determine the distance to a reflective object.

Figure 6A:
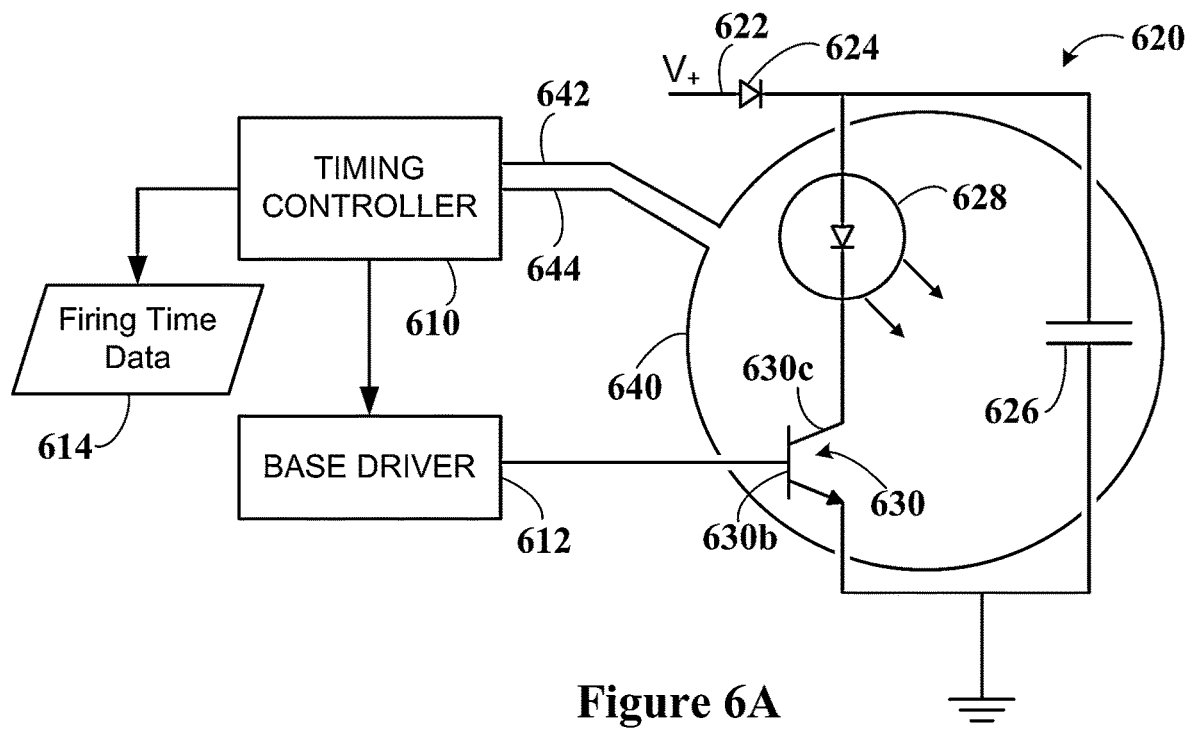
FIG. 6A is an example laser diode firing circuit including a feedback trace loop in which the laser diode is triggered by an avalanche transistor.

FIG. 6A is an example laser diode firing circuit 620 including a feedback trace loop 640 in which the laser diode 628 is triggered by an avalanche transistor 630. An avalanche transistor is a bipolar junction transistor that is configured to operate in an avalanche mode in which, upon exceeding an avalanche breakdown voltage between the base and collector, free charge carriers (electrons) ionize additional carriers in the semiconductive lattice via collisional interactions in a multiplying, avalanche effect to rapidly increase the conductivity of the transistor and switch large currents through the collector. Avalanche transistors are capable of switching relatively large currents (e.g., 30 amperes) with a brief rise time (e.g., less than one nanosecond) due to the rapid effect of avalanche multiplication. However, the precise timing of initiation of the avalanche effect is subject to some delay between the time an initiating signal is applied to the base and the time the collector current begins flowing. Some of the time delay is due to systematic, substantially repeatable delays caused by, e.g., device geometry, carrier mobility, development of the avalanche breakdown voltage on the base of the avalanche transistor, etc. Some of the time delay is due to random delays caused by, e.g., quantum effects of one or more electrons becoming sufficiently thermally energized to initiate the avalanche effect that transitions the transistor a conductive mode, etc.

Referring again to the laser diode firing circuit 620 of FIG. 6A, a voltage supply line 622 supplies voltage to charge a capacitor 626 (via the bias diode 624) while the avalanche transistor 630 is turned off (i.e., collector current near zero). The avalanche transistor 630 is connected to the capacitor 626 and the laser diode 628 such that turning on the avalanche transistor 630 (i.e., changing to a non-zero collector current) causes the capacitor 626 to discharge through the laser diode 628 to the collector terminal 630c, thereby causing the laser diode 628 to emit light. The laser diode firing circuit 620 is controlled by a timing controller 610, which sends signals to operate a base driver module 612, and the base driver 612 in turn controls the avalanche transistor 630 by applying signals to the base terminal 630b of the avalanche transistor 630.

A feedback trace loop 640 is situated in a plane approximately parallel to the plane of the firing circuit such that the portion of the firing circuit 620 that follows a boundary of a closed shape (e.g., the U-shaped portion between the capacitor 626 and transistor 630) overlaps the enclosed region of the feedback loop 640. The feedback loop 640 is situated to inductively react to changes in current flow in the firing circuit 620. The feedback trace loop 640 can be a continuous strip of conductive material that is situated under the firing circuit 620 (e.g., on a plane substantially parallel to a plane of the firing circuit 620). In some examples, the components of the firing circuit 620 may be disposed on one side of a printed circuit board (PCB) or another substrate and the trace loop 640 may be patterned on an opposite side of the PCB, or patterned in an inner layer of a laminated PCB or other substrate. Additionally or alternatively, firing circuit components may be printed on either side of a PCB substrate, with conductive vias connecting components situated on either side of the PCB so as to form the firing circuit 620, and the feedback trace loop 640 may be formed in an inner layer or on one side.

The timing controller 610 operates the firing circuit 620 by instructing the base driver 612 to provide signals to the base terminal 630b of the avalanche transistor 630. In response to signals applied to the base terminal 630b, the current through the collector terminal 630c changes. The base driver 612 can thereby be used to turn on and turn off the avalanche transistor 630. The timing controller 610 may be implemented as a suitably configured field programmable gate array (FPGA). The timing controller 610 may include, for example, an oscillator or another reference clock source to regulate the timing of signals sent to the base driver 612. The timing controller 610 also receives signals from the conductive trace loop 640 via the leads 642, 644. The leads 642, 644 of the conductive loop 640 may be connected to a differential input of the timing controller that is configured to register changes in the voltage between the leads 642, 644.

The base driver 612 can include electronics configured to receive the signals from the timing controller 610 and generate corresponding control signals to apply to the base terminal 630b of the avalanche transistor 630 so as to influence the collector current (i.e., the current flowing through the collector terminal 630c). For example, the base driver 612 can include an adjustable current source that applies a current to the base terminal 630b in accordance with the signals received from the timing controller 610. The timing controller 610 may thus cause the laser diode to emit light by instructing the base driver 612 to provide a suitable current to the base terminal 630b (e.g., an initiating signal). The base driver 612 applies a signal to the base terminal 630b sufficient to cause the avalanche transistor 630 to operate in avalanche mode, which connects the capacitor 626 across the laser diode 628, via the avalanche transistor 630, and results in current flowing through the laser diode 628 to discharge the capacitor 626. Emission from the laser diode 628 may be halted by the base driver 612 providing a signal to the base terminal 630b of the avalanche transistor 630 to reduce the collector current (e.g., reduce the current to zero).

Figure 6B:
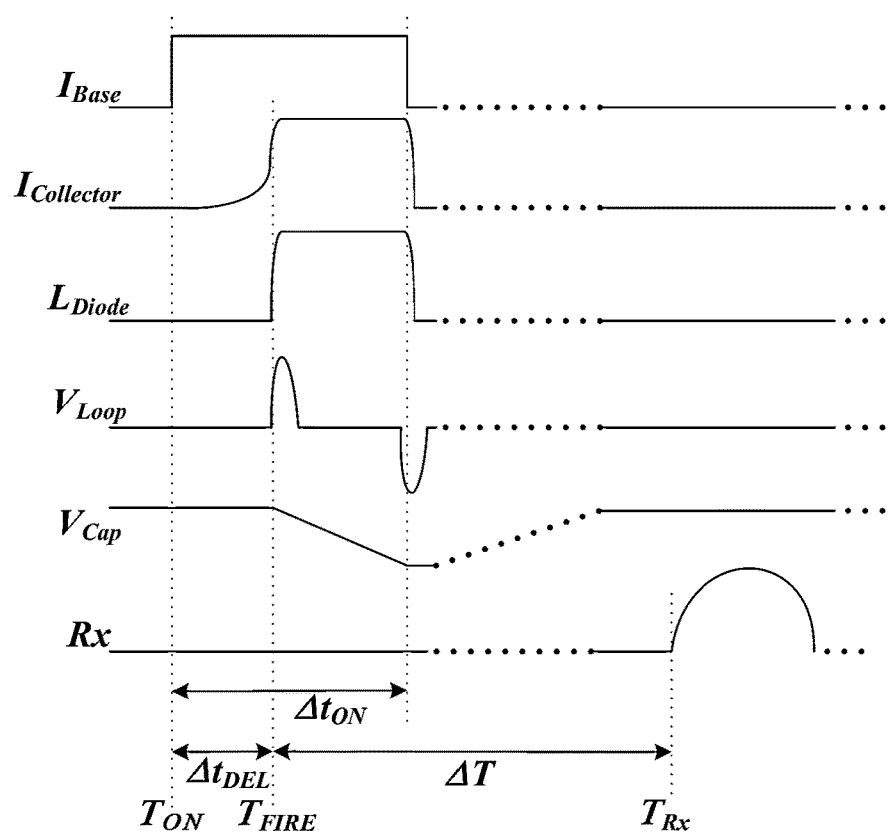
FIG. 6B is a timing diagram of a pulse emission operation of the example laser diode firing circuit of FIG. 6A.

FIG. 6B is a timing diagram of a pulse emission operation of the example laser diode firing circuit of FIG. 6A. Shown in FIG. 6B is the base current $I_{Base}$ of the avalanche transistor 630, the collector current $I_{Collector}$ of the avalanche transistor 630, the luminosity $L_{Diode}$ of the laser diode 628, the induced voltage $V_{Loop}$ of the feedback loop 640, the voltage $V_{Cap}$ of the capacitor 626, and the light signal received Rx from a reflected portion of the emitted pulse. For convenience in the description, the time at which the avalanche transistor 630 transitions to avalanche mode (and current flows through the collector) is referred to herein and in the drawings as the firing time $T_{FIRE}$. The time at which an initiating signal is applied to the transistor is referred to here and in the drawings as the turn on time $T_{ON}$.

Initially, the capacitor 628 is charged to a voltage set by the voltage supply 622, the avalanche transistor 630 is turned off (i.e., collector current near zero). At the turn on time $T_{ON}$, an initiating signal is applied to the avalanche transistor 630 from the base driver 612. The initiating signal can be a base current, as shown in FIG. 6B. The avalanche transistor 630 transitions to avalanche mode during a time delay $\Delta t_{DEL}$, which time delay includes both repeatable systematic delay $\Delta t_{SYS}$ and random timing jitter $\Delta t_{JITTER}$. The avalanche transistor 630 fires at $T_{FIRE}$ and the collector current transitions from near zero current to an avalanche mode current sufficient to drive the laser diode 628. The laser diode 628 then begins emitting a pulse of light at the firing time $T_{FIRE}$, as indicated by the luminosity $L_{Diode}$ of the laser diode 628. As the collector current $I_{Collector}$ flows through the laser diode 628, the capacitor 626 discharges until the avalanche transistor 630 is turned off, which occurs following a duration $\Delta t_{ON}$ after the turn on time $T_{ON}$. The avalanche transistor 630 can be turned off by, for example, adjusting the base current $I_{Base}$ using the base driver 612. Upon turning off the avalanche transistor 630, the laser diode 628 ceases emission (as indicated by $L_{Diode}$ in FIG. 6B) and the capacitor 626 recharges to the value set by the supply voltage 622.

The light pulse emitted at time $T_{FIRE}$ can then be reflected from an environmental object, such as an obstacle surrounding an autonomous vehicle, and a light signal from the reflected portion of the emitted pulse is received via a photo detector at reception time $T_{Rx}$. The time $\Delta T$ between the emission time (at $T_{FIRE}$, indicated by the induced current $I_{LOOP}$) and the reception time $T_{Rx}$ can then be used to calculate the distance to the reflective object. For example, the round trip travel time $\Delta T$ can be multiplied by the speed of light in the surrounding atmosphere to get the round trip distance, which is twice the distance to the reflective object. By calculating the distance based on the emission time as derived using the inductive feedback loop 640 (i.e., from the change in voltage and/or current monitored across the leads 642, 644), the distance estimate is not influenced by the random timing jitter $\Delta t_{JITTER}$ associated with the firing of the avalanche transistor 630.

The time that the pulse is emitted from the laser diode 628 (e.g., the firing time $T_{FIRE}$) is indicated by the non-zero value of $V_{Loop}$ that is induced in the feedback loop 640. The timing controller 610 is configured to monitor the leads 642, 644 of the feedback loop 640, detect an induced voltage, and determine the firing time $T_{FIRE}$ based on the time the induced voltage occurs. Data 614 indicative of the firing time $T_{FIRE}$ derived by the timing controller 610 may be output from the timing controller 610 or saved within a memory of the timing controller 610 for future retrieval. For example, the firing timing data 614 may be used in combination with an estimate of a reception time of a reflected light signal to estimate a distance to a reflective object.

Figure 6C:
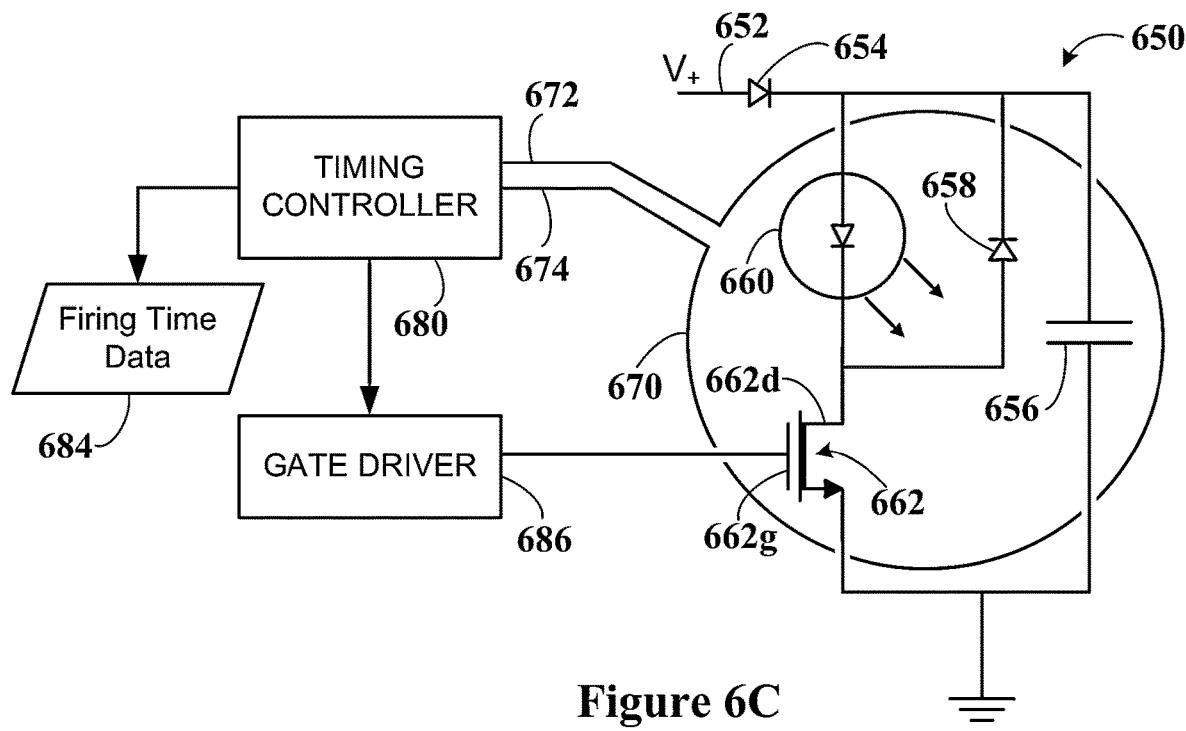
FIG. 6C is an example laser diode firing circuit including a feedback trace loop in which the laser diode is triggered by a field effect transistor.

FIG. 6C is an example laser diode firing circuit 650 including a feedback trace loop 670 in which the laser diode 660 is triggered by a field effect transistor 662. The field effect transistor (FET) 662 may be, for example, a Gallium nitride FET (GaNFET) or another FET with a semiconductive channel material suitable for high speed switching. The firing circuit 650 operates similarly to the firing circuit 620 described in connection with FIGS. 6A-6B above, but with the FET 662 being connected in series to the laser diode 660 rather than an avalanche transistor. The FET 662 is turned on and turned off (i.e., set to conduct a drain current via the drain terminal 662d or not) by a gate driver module 686 that applies a voltage to the gate terminal 662g of the FET 662. In addition, the firing circuit 650 includes a discharge diode 658 that is coupled across the laser diode 660 to allow the internal capacitance of the laser diode 660 to discharge in between successive firings of the laser diode 660. The discharge diode 658 has an anode and a cathode and is arranged with its anode connected to the cathode of the laser diode 660 and its cathode connected to the anode of the laser diode 660.

The firing circuit 650 also includes a capacitor 656 that is charged via a voltage supply line 652 (connected through a biasing diode 654). The capacitor 656 is charged between the voltage supply line 652 and ground while the FET 662 is turned off. When the FET 662 is switched on (e.g., by application of a sufficient gate voltage to the gate terminal 662g), the capacitor 656 rapidly discharges though the laser diode 660 to the drain 662d of the FET 662. The discharge current flowing through the laser diode 660 causes the laser diode 660 to emit a pulse of light. The discharge current also induces a voltage in the feedback loop 670, which is then detected by the timing controller 680 that monitors voltage on the leads 672, 674 of the feedback loop 670. The timing controller 680 can determine the emission time $T_{FIRE}$ of the pulse emitted by the laser diode 660 based on the induced voltage in the feedback loop 670. The timing controller 680 may generate data 684 indicative of the determined pulse emission time, which data 684 can be retrievably stored for use in determining a distance to a reflective object.

Figure 6D:
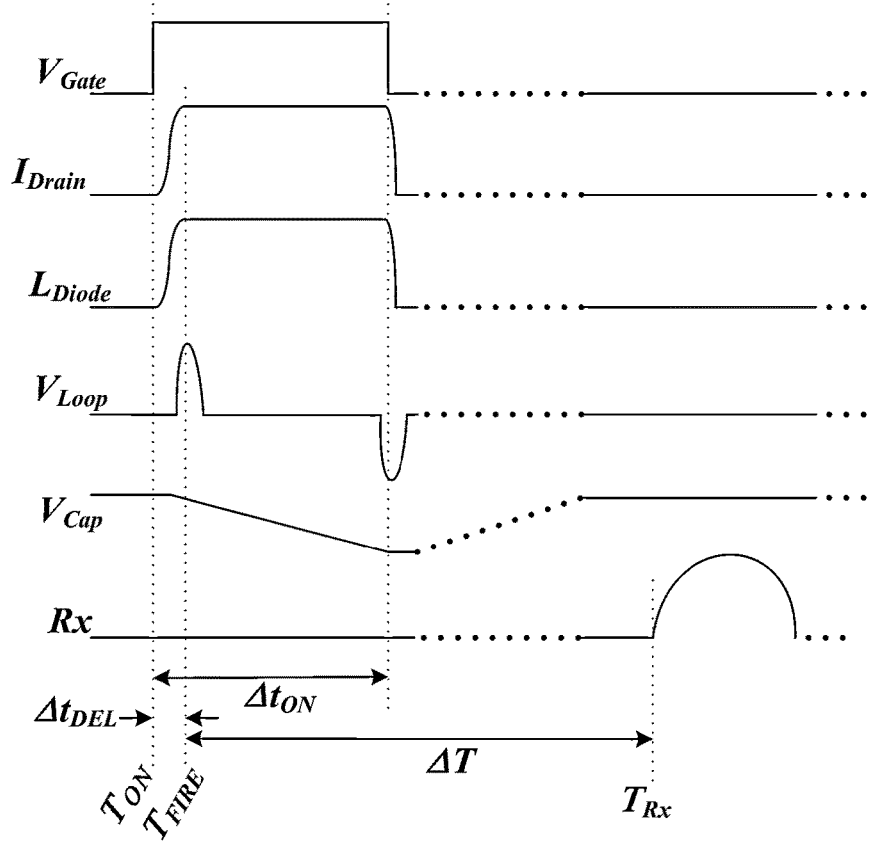
FIG. 6D is a timing diagram of a pulse emission operation of the example laser diode firing circuit of FIG. 6C.

FIG. 6D is a timing diagram of a pulse emission operation of the example laser diode firing circuit 650 of FIG. 6C. Shown in FIG. 6D is the gate voltage $V_{Gate}$ applied by the gate driver 686 to the gate 662g, the drain current $I_{Drain}$ of the FET 662, the luminosity $L_{Diode}$ of the laser diode 660, the induced voltage $V_{Loop}$ in the feedback loop 670, the voltage $V_{Cap}$ of the capacitor 656, and the light signal received Rx from a reflected portion of the emitted pulse. Unlike the avalanche transistor in FIGS. 6A-6B, the FET 662 does not exhibit as much random timing jitter, because the FET 662 does not function by activation of an avalanche mode to conduct a sufficient current to fire the laser diode 660. However, a timing offset AtDEL may occur between the application of the turn on voltage from the gate driver 686, at time $T_{ON}$, to the pulse emission time, which occurs upon firing of the laser diode 660, at time $T_{FIRE}$. The feedback loop 670 can be used to detect the firing of the laser diode 660 by monitoring the voltage across the leads 672, 674 (shown as $V_{Loop}$ in FIG. 6D). Following the firing time $T_{FIRE}$, the capacitor 656 discharges through the laser diode 660 and the FET 662, until the gate driver 686 turns the FET 662 off after an interval $\Delta t_{ON}$ (by adjusting the voltage applied to the gate terminal 662g). Once the FET 662 turns off, the capacitor 656 ceases discharging and the laser diode 660 ceases emitting.

The light pulse emitted at time $T_{FIRE}$ can then be reflected from an environmental object, such as an obstacle surrounding an autonomous vehicle, and a light signal from the reflected portion of the emitted pulse is received via a photo detector at reception time $T_{Rx}$. The time $\Delta T$ between the emission time (at $T_{FIRE}$, indicated by the induced voltage $VL_{oop}$) and the reception time $T_{Rx}$ can then be used to calculate the distance to the reflective object. For example, the round trip travel time $\Delta T$ can be multiplied by the speed of light in the surrounding atmosphere to get the round trip distance, which is twice the distance to the reflective object. By calculating the distance based on the emission time as derived using the inductive feedback loop 640 (i.e., from the voltage between the leads 672, 674), the estimate of the emission time $T_{FIRE}$ is not influenced by the random timing jitter $\Delta t_{JITTER}$ associated with the firing of the avalanche transistor 630.

Figures 6E, 6F:
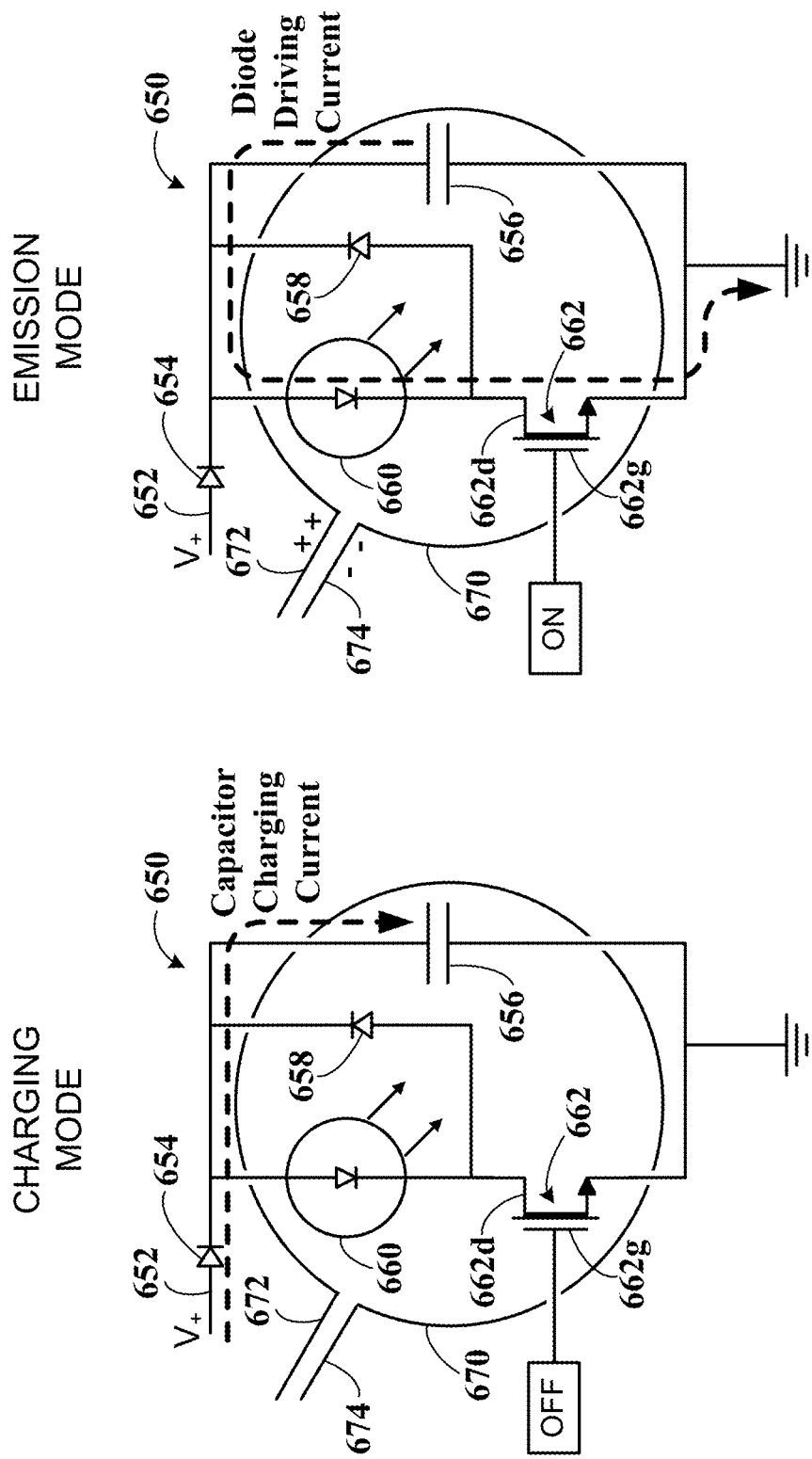
FIG. 6E shows a current path through the example laser diode firing circuit of FIG. 6C during a charging mode.
FIG. 6F shows a current path through the example laser diode firing circuit of FIG. 6C during an emission mode.

FIG. 6E shows a current path through the example laser diode firing circuit 650 of FIG. 6C during a charging mode. During charging, the FET 662 is turned off (as indicated by the OFF block coupled to the gate terminal 662g in FIG. 6E). As such, current from the voltage supply line 652 does not flow through the laser diode 660, and instead flows to accumulate charge across the capacitor 656. The dashed arrow in FIG. 6E illustrates such a charging current path, which flows from the voltage supply line 652, through the biasing diode 654 toward the capacitor 656, where the capacitor 656 charges. In some examples, following a discharge, the capacitor 656 can be recharged in preparation for a subsequent discharge (and associated pulse emission) event in about 500 nanoseconds.

FIG. 6F shows a current path through the example laser diode firing circuit 650 of FIG. 6C during an emission mode. During emission, the FET 662 is turned on (as indicated by the ON block coupled to the gate terminal 662g in FIG. 6F). As such, the capacitor 656 is connected across the laser diode 660 (via the turned on FET 662), and so the charge on the capacitor 656 rapidly discharges through the laser diode 660 and the FET 662. The dashed arrow in FIG. 6F illustrates such a discharge current path, which flows from the capacitor 656, through the laser diode 660 and the FET 662 toward ground. Upon the FET 662 being turned on, the discharge current flows rapidly to discharge the capacitor 656 and the resulting change in current (e.g., increase in current) causes the laser diode 660 to emit a pulse of light.

The current paths shown in FIGS. 6E and 6F illustrate two operation modes of the firing circuit 650: a charging mode (FIG. 6E) and an emission mode (FIG. 6F). In some examples, the firing circuit 650 switches between the charging mode and the emission mode based solely on whether the FET 662 is turned on or turned off. In the charging mode, the FET 662 is turned off and current flows from the voltage supply line 652 to the capacitor 656 via a charging path until the capacitor 656 is recharged. In the emission mode, the FET 662 is turned on and current flows from the charged capacitor 656 through the laser diode 660 and the FET 662 until the FET 662 is turned off again.

Figure 7B:
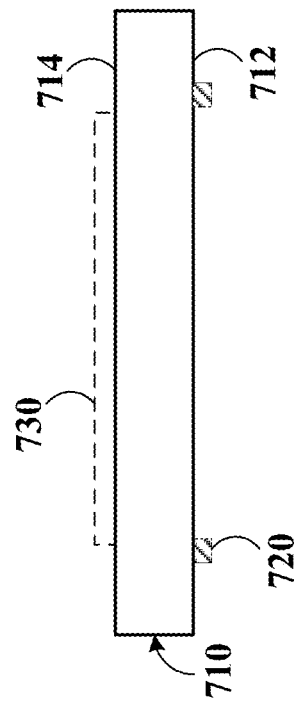
FIG. 7B is a cross-section view of the printed circuit board shown in FIG. 7A.
Figure 7C:
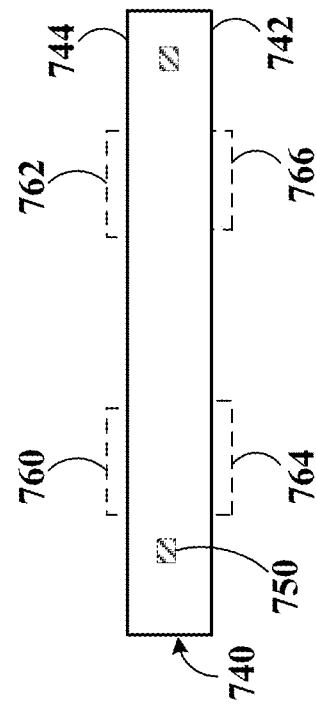
FIG. 7C is a cross-section view of an alternative printed circuit board having a feedback trace loop disposed in an internal layer and diode firing circuit elements on one or both sides of the feedback loop.
Figure 7A:
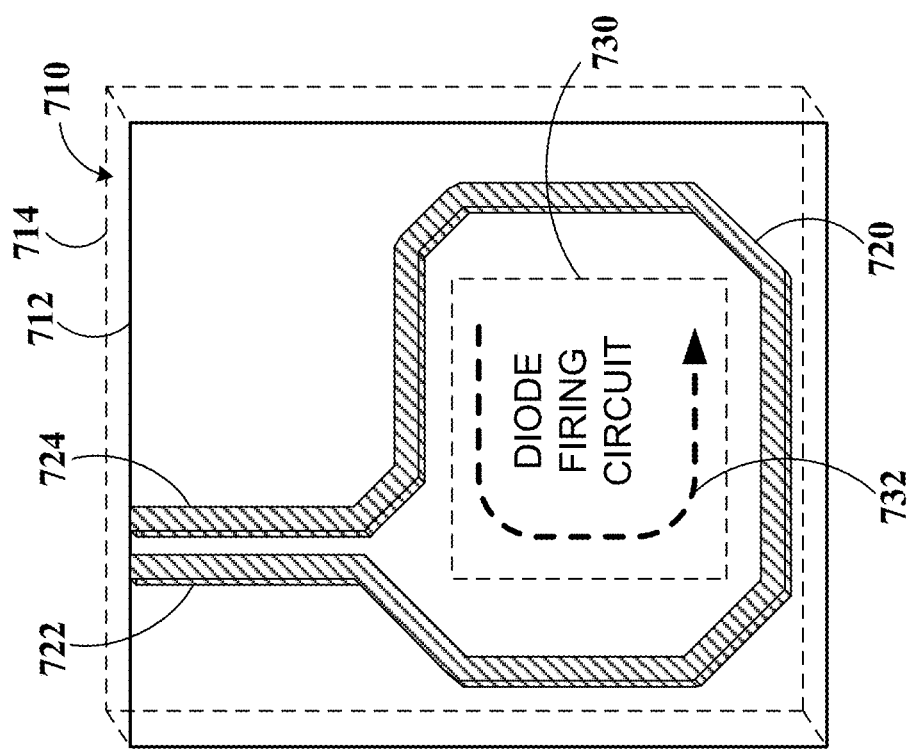
FIG. 7A is an example printed circuit board having a feedback trace loop disposed on one side and a diode firing circuit on the other side.

FIG. 7A is an example printed circuit board (PCB) 710 having a feedback trace loop 720 disposed on one side 712 and a laser diode firing circuit 730 on the other side 714.

FIG. 7B is a cross-section view of the PCB 710 shown in FIG. 7A. The diode firing circuit 730 includes a discharge current path 732, which is illustrated in FIG. 7A. As shown, the discharge current path 732 at least partially traces a boundary of a closed shape (e.g., a portion of a rectangle, circle, polygon, etc.), such that current through the discharge path 732 causes a change in magnetic flux directed transverse to the firing circuit 730. At the same time, the feedback loop 720 is positioned to at least partially overlap the flux-generating portions of the firing circuit 730 (e.g., located such that the changing magnetic flux from the discharge current path 732 passes through the feedback loop 720). The feedback loop 720 may be used to detect a pulse emission time from the diode firing circuit 730, because current flowing through the discharge current path 732 of the firing circuit 730 causes a change in magnetic flux through the feedback loop 720, which then induces a voltage in the feedback loop 720. The induced voltage in the feedback loop 720 can be detected by monitoring the voltage across the leads 722, 724 of the feedback loop.

In some examples, the firing circuit 730 is disposed on a side of the PCB 710. For example, a transistor may be developed by deposition or other microfabrication techniques directly on the side surface 714 of the PCB 710 (or other substrate). Interconnects between the transistor and connection pads for a laser diode, and other control circuitry (e.g., a gate driver, timing controller, etc.) may also be formed on the PCB 710. As a result, the discharge path 732 of the firing circuit 730 may be situated along the side surface 714 of the PCB 710, or approximately co-planar to the side surface 714 of the PCB 710. The feedback loop 720 can be formed of a conductive trace patterned on the PCB 710 along the opposite side 712 of the PCB 710. The feedback loop 720 is preferably positioned to at least partially overlap the diode firing circuit 730.

FIG. 7C is a cross-section view of an alternative printed circuit board (PCB) 740 having a feedback trace loop 750 disposed in an internal layer and diode firing circuit elements 760-766 on one or both sides 742, 744 of the PCB 740. The components 760-766 may include connection pads for mounting components to the PCB 740, such as a laser diode module. The components 760-766 may also include a circuit component that is developed on the PCB substrate, such as a field effect transistor assembled by depositing layers of conductive terminals and a suitable semiconductive channel. Interconnects between the PCB 740 can pass between the components on opposing sides 742, 744 as needed such that the resulting firing circuit has a discharge current path that is arranged to induce a voltage in the feedback loop 750.

Figure 8:
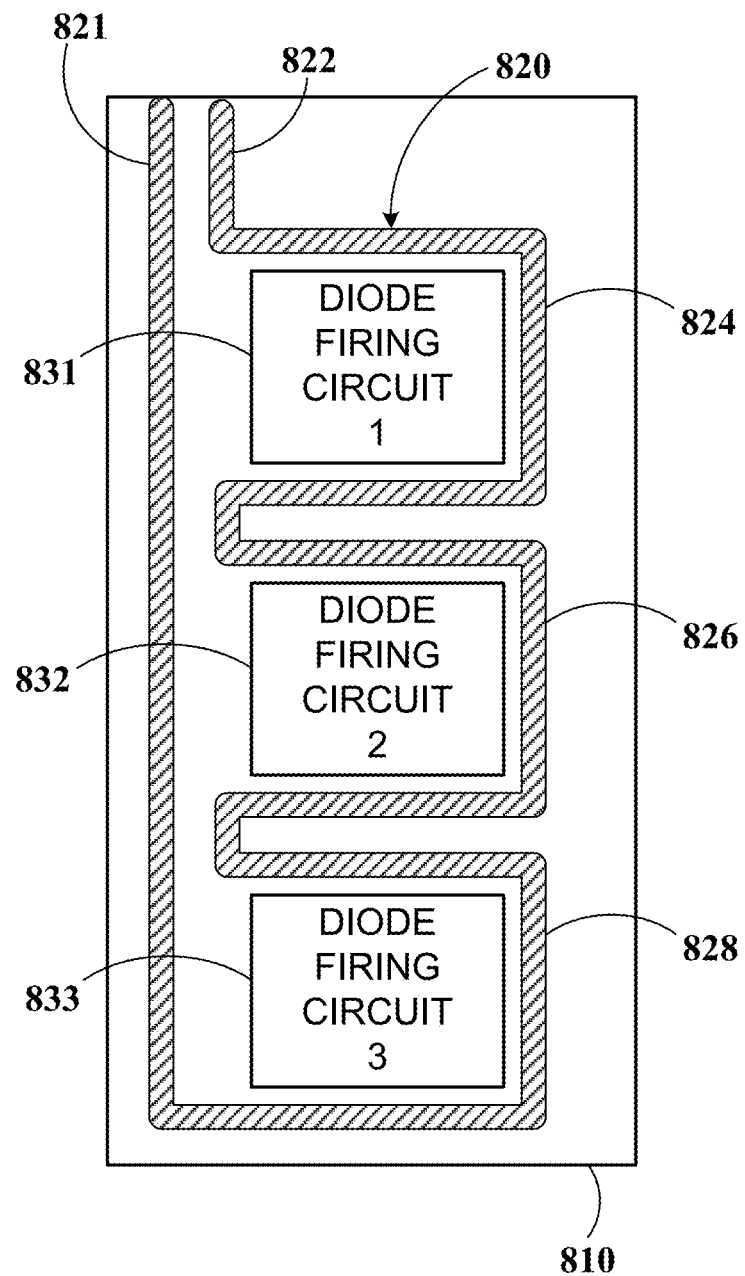
FIG. 8 is an example configuration in which a single feedback loop surrounds multiple diode firing circuits.

FIG. 8 is an example configuration in which a single feedback trace 820 is arranged to loop around multiple diode firing circuits. The diode firing circuits 831-833 can each be arranged on a single mounting substrate 810, such as a printed circuit board. The firing circuits 831-833 can each control the emission from a single laser diode, and the array of laser diode firing circuits may be included within a LIDAR device to emit pulses of light that illuminate a scanning zone. Each firing circuit 831-833 can therefore include a discharge current path that includes a laser diode connected in series with a transistor such that the transistor that controls current through the laser diode. The firing circuits 831-833 are arranged such that their respective discharge current paths are arranged with at least a portion that follows along a boundary of a closed shape, such that current flowing through the discharge path induces current in overlapping portions of the feedback loop 820 via changing magnetic flux.

As shown in FIG. 8, the feedback trace loop 820 includes a first portion 824 that overlaps the first diode firing circuit 831. A discharge current flowing in the first diode firing circuit 831 induces current along the first portion, which can be detected by monitoring the voltage on the leads 821, 822 of the feedback loop 820. Similarly, the feedback trace loop 820 includes a second portion 826 that overlaps the second diode firing circuit 832 and a third portion 828 that overlaps the third diode firing circuit 833. Voltage induced along any of the portions 824, 826, 828 results in a voltage across the leads 821, 822. As such, monitoring the voltage across the leads 821, 822 can be used to detect the pulse emission times from each of the firing circuits 831-833. In an example in which the firing circuits 831-833 are each fired at different times (e.g., in succession), the feedback loop voltage change that most nearly follows the time a given firing circuit is turned on can be used to determine the pulse emission time of that circuit. For example, the firing circuit associated with a given voltage change detected on the feedback loop 820 can be the circuit that was most recently turned (e.g., by a signal to a firing transistor from a gate driver).

Moreover, the illustration in FIG. 8 of three diode firing circuits monitored by a single feedback loop 820 is provided by way of example only. Some embodiments may include a single feedback trace loop that is arranged to detect pulse emissions from more than three diode firing circuits. For example, a single feedback trace loop may overlap 16 diode firing circuits. Other examples are possible as well.

Figure 9:
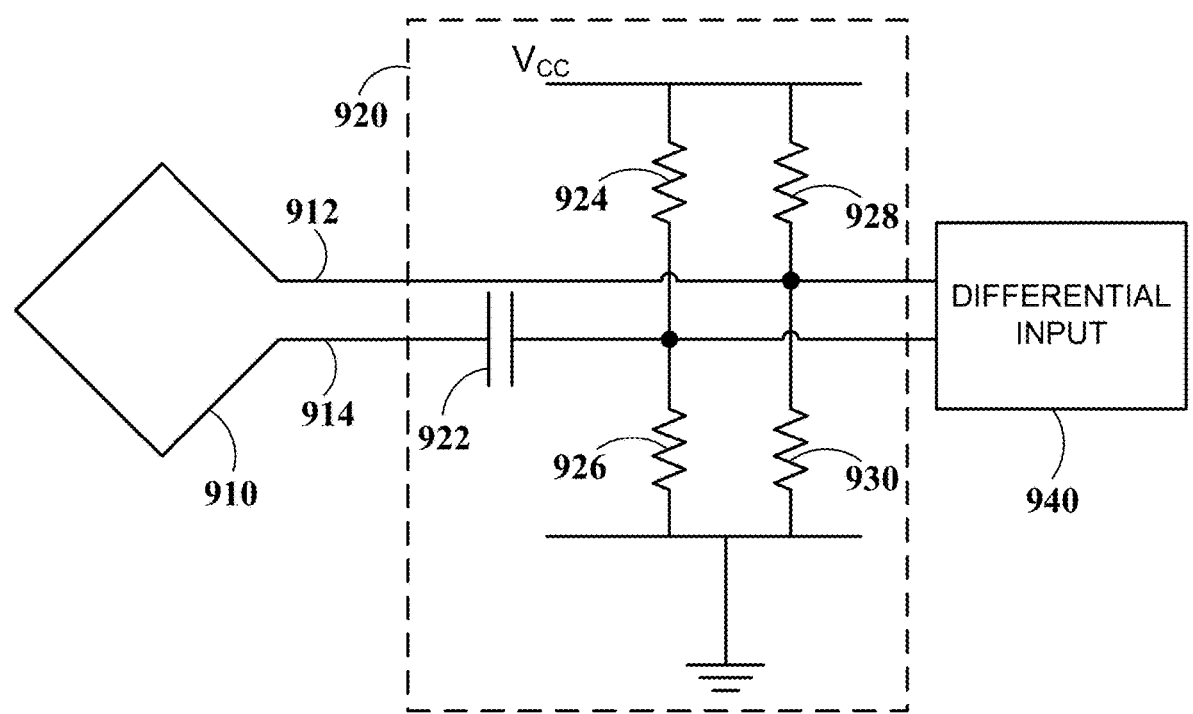
FIG. 9 is an example circuit for connecting the output of a feedback loop to a differential input of a timing system.

FIG. 9A is an example circuit 920 for connecting the output of a feedback loop to a differential input 940 of a timing system. A feedback loop 910 has a first lead 912 and a second lead 914 that each connect to the circuit 920. The circuit 920 conditions the voltage between the leads to a level that can be read by the differential input 940. In some examples, the differential input 940 can be a pair of inputs on a field programmable gate array (FPGA) configured to detect changes from a high voltage (e.g., 1.2 volts) and a low voltage (e.g., zero volts). A capacitor 922 can be connected to one of the leads 914 to reduce the influence of any low-frequency bias on the voltage at the differential input 940. The circuit 920 can also include resistors 924-930 connected between a first reference voltage line (e.g., $V_{CC}$) and a second reference voltage line (e.g., ground) that divide voltage between the two leads 912, 914. For example, the second lead line 914 can be coupled to $V_{CC}$ through a first resistor 924 and to ground through a second resistor 926. The second lead line 914 can be coupled to $V_{CC}$ through a first resistor 928 and to ground through a second resistor 930.

In some examples, the resistors 924-930 can be configured to set the voltage at the differential input 940 (i.e., the voltage between the leads 912, 914) to be approximately 1.2 volts when the voltage in the feedback loop 910 is zero, and then drop to 0 volts in response to the induced voltage in the feedback loop 910. Upon a voltage being induced in the feedback loop 910 (e.g., due to current in an overlapping diode firing circuit), the voltage difference between the two lead lines is modified, at least momentarily. In some examples, the differential input 940 can detect a change in the differential voltage from a high level (e.g., about 1.2 volts) to a low level (e.g., about zero volts). The differential input 940 may also be used to set or reset a state circuit (e.g., a sample and hold circuit, a latch circuit, etc.). While an induced voltage is applied to the feedback loop 910 (e.g., due to current in an overlapping diode firing circuit), the voltage between the leads 912, 914 may at least temporarily reach zero. The time at which the voltage reaches zero can then be detected via the differential input 940 to determine the pulse emission time in coordination with a timing system, for example.

The resistor 924 connected between the second lead line 914 and $V_{CC}$ may be about 20 kiloohms (kΩ); the resistor 926 connected between the second lead 914 and ground may be about 10 kΩ. In such an example, the second lead line 914 is biased to about 1.1 volt for $V_{CC}$ at 3.3 volts. The resistor 928 connected between the first lead line 912 and $V_{CC}$ may be about 22 kΩ; the resistor 930 connected between the first lead line 912 and ground may be about 10 kΩ. In such an example, the first lead line 912 is biased to about 1.0 volts for $V_{CC}$ at 3.3 volts. By biasing the first lead line 912 at about 1.0 volt instead of about 1.1 volt (as on the second lead line 914), the differential input 940 only registers events with a differential voltage greater than 0.1 volts. Thus, in some embodiments, the induced voltage generated in the feedback loop 910 is at least 0.1 volts to be detected via the differential input 940. The offset in bias voltage between the lead lines 912, 914 thereby prevents the timing circuit 920 from sampling noise, as would occur if both lead lines 912, 914 were to be biased to the same voltage (e.g., by respective resistors 924, 928 and 926, 930 having the same values).

Furthermore, the pulse of induced voltage detected by the differential input 940 may be distorted due to the nature of transformer coupling between the overlapping diode firing circuit and the feedback loop 910. As a result, the timing registered by the differential input 940 may be offset (e.g., delayed) from the rising edge of the pulse emission time. However, the timing offset between the peak of the emitted light pulse and the time when the feedback circuit registers an event depends on fixed circuit parameters, namely circuit geometry. Such a timing offset can therefore by characterized once (e.g., during an initial calibration process), and subsequent estimates of the pulse emission time based on the voltage induced in the feedback loop can account for the timing offset. For example, a calibrated timing offset can be stored in a memory for future retrieval and then estimates of pulse emission times can be based both on timing information detected by the feedback loop and also the stored timing offset. Such calibrations may optionally be updated periodically and/or intermittently, as part of routine maintenance, etc.

Using the conditioning circuit 920 allows the voltage across the leads 912, 914 of the feedback loop 910 to be at a level suitable for input to a differential input of a field programmable gate array (FPGA), for example, at logic levels, at low voltage differential signaling (LVDS) inputs, etc. As a result, changes in the detected voltage can be measured and used to calculate a pulse emission time without employing an analog to digital converter or the like to condition the voltage values for input to the timing controller, which may be implemented as an FPGA. The circuit 920 thereby avoids any further time delay in detecting the change in voltage that would be caused by additional intermittent modules (e.g., digital to analog converters, etc.).

For example, the feedback loop 910 may be positioned to overlap a diode firing circuit, similar to the firing circuit feedback loops described above in connection with FIGS. 5-8. In such an example, upon commencement of emission from the laser diode, the voltage in the feedback loop 910 changes. The change may cause the voltage across the leads 912, 914, at the differential input 940, to transition from a high level (caused by the circuit 920 in the absence of an induced current) to a low level. The timing of the transition to zero voltage at the differential input 940 can then be used to determine the pulse emission time (i.e., the laser diode firing circuit's firing time $T_{FIRE}$).

LIDAR devices employing the inductive feedback loop described herein are able to achieve enhanced spatial resolution in performing distance measurements to environmental reflective objects relative to conventional systems. In particular, the inductive feedback loop equipped systems described herein can reduce uncertainty in pulse emission times due to timing jitter between application of an initiating signal and initiation of current flow in a transistor used to control current delivered to a laser diode. Some embodiments disclosed herein enable timing uncertainties of the pulse emission time to be as little as about 100 picoseconds, which translates to about 1.3 centimeter RMS uncertainty in distance measurements (i.e., the spatial resolution of the resulting point cloud scan). Such spatial resolutions are particularly helpful at close range applications of a LIDAR scanner.

V. Example Operations

Figure 10A:
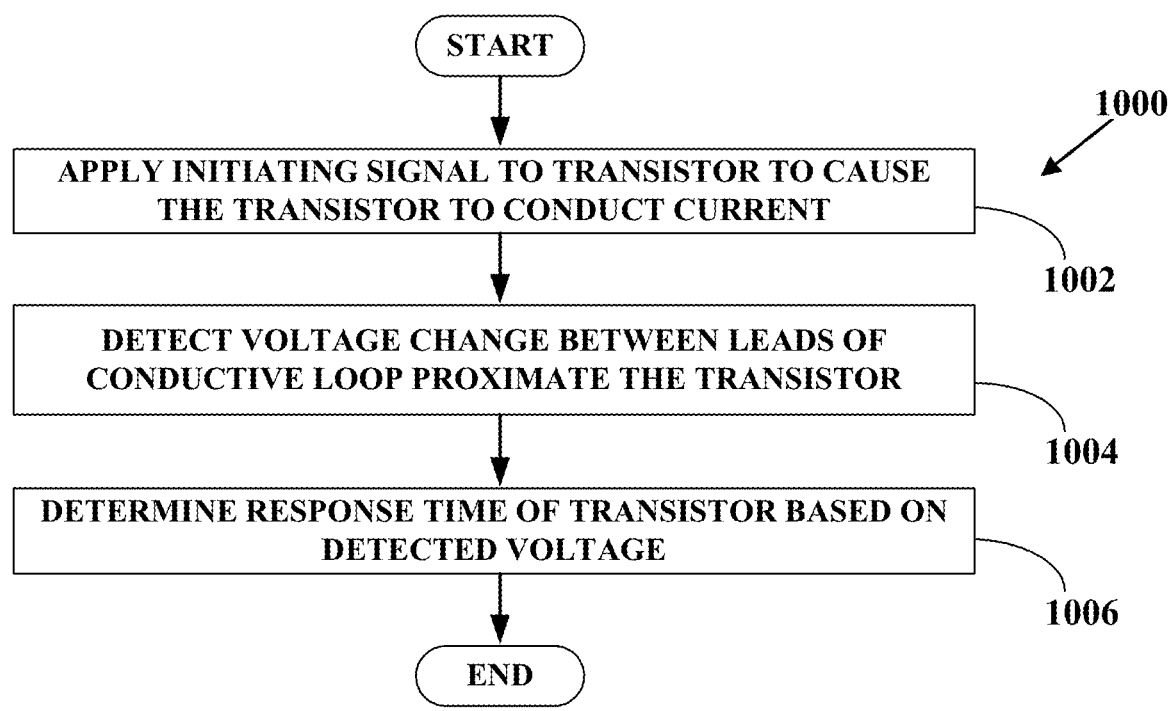
FIG. 10A is a flowchart of an example process for determining a response time of a transistor using a feedback trace loop.
Figure 10B:
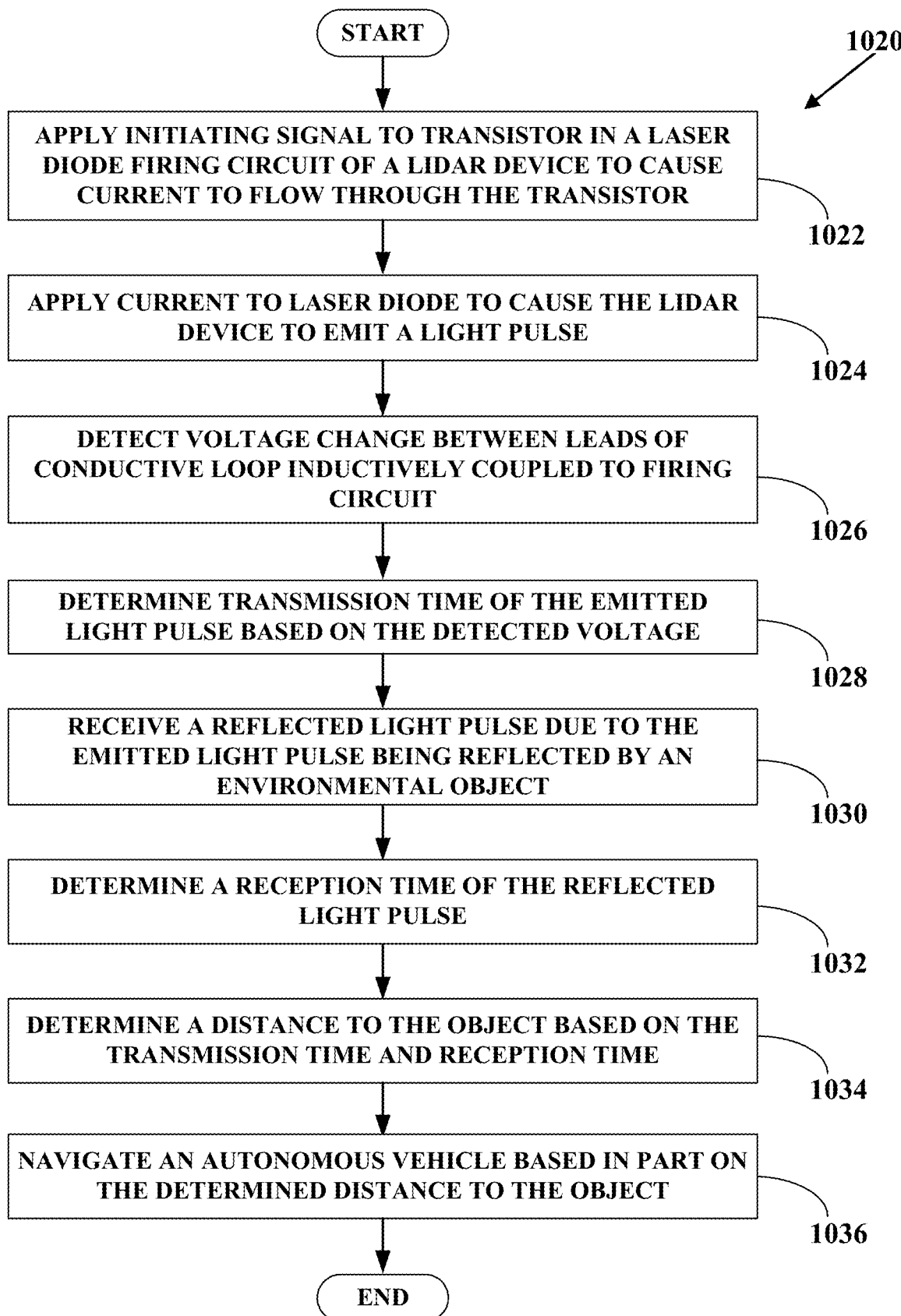
FIG. 10B is a flowchart of an example process for operating a LIDAR device using a feedback trace loop to determine a pulse emission time.

FIGS. 10A and 10B present flowcharts describing processes employed separately or in combination in some embodiments of the present disclosure. The methods and processes described herein are generally described by way of example as being carried out by an autonomous vehicle, such as the autonomous vehicles 100, 200 described above in connection with FIGS. 1 and 2. For example, the processes described herein can be carried out by the LIDAR sensor 128 mounted to an autonomous vehicle in communication with the computer system 112, sensor fusion algorithm module 138, and/or computer vision system 140.

Furthermore, it is noted that the functionality described in connection with the flowcharts described herein can be implemented as special-function and/or configured general-function hardware modules, portions of program code executed by a processor (e.g., the processor 113 in the computer system 112) for achieving specific logical functions, determinations, and/or steps described in connection with the flowcharts. Where used, program code can be stored on any type of computer readable medium (e.g., computer readable storage medium or non-transitory media, such as data storage 114 described above with respect to computer system 112), for example, such as a storage device including a disk or hard drive. In addition, each block of the flowcharts can represent circuitry that is wired to perform the specific logical functions in the process. Unless specifically indicated, functions in the flowcharts can be executed out of order from that shown or discussed, including substantially concurrent execution of separately described functions, or even in reverse order in some examples, depending on the functionality involved, so long as the overall functionality of the described method is maintained. Furthermore, similar combinations of hardware and/or software elements can be employed to implement the methods described in connection with other flowcharts provided in the present disclosure.

FIG. 10A is a flowchart of an example process 1000 for determining a response time of a transistor using a feedback trace loop. At block 1002, a signal can be applied to a transistor to cause the transistor to conduct current. For example, an initiating base current can be applied to an avalanche transistor to cause the avalanche transistor to begin conducting a collector current. In another example, a gate voltage can be applied to a field effect transistor to cause the transistor to begin conducting a drain current. The current that begins flowing through the transistor can be conveyed through a current path that follows at least a portion of a closed shape, and therefore includes one or more corners, bends, etc. As a result, commencement of current flowing through the transistor is accompanied by a change in magnetic flux transverse to a plane of the current path controlled by the transistor. A conductive feedback loop can be situated proximate to the transistor so as to receive changing magnetic flux generated by the transistor-controlled current path and thereby induce a current in the feedback loop. At block 1004, a voltage can be detected between leads of the conductive feedback loop. At block 1006, a response time of the transistor can be determined based on the detected voltage. For example, a time at which current begins flowing through the transistor may be determined by identifying the time at which a voltage change is detected between the leads of the feedback loop.

FIG. 10B is a flowchart of an example process 1020 for operating an autonomous vehicle based in part on a LIDAR device using a feedback trace loop to determine a pulse emission time. The LIDAR device includes a light source having a laser diode firing circuit in which current through the laser diode is controlled by a series-connected transistor. The firing circuit is situated proximate to a conductive loop that is inductively coupled to a current path through the firing circuit that includes the laser diode, such that the conductive loop provides feedback on the pulse emission time from the firing circuit. At block 1022, an initiating signal is applied to the transistor so as to cause current to flow through the transistor. At block 1024, current flowing through the transistor is applied to the laser diode so as to cause the LIDAR device to emit a pulse of light. At block 1026, a change in voltage is detected between the leads of an inductively coupled conductive loop. At block 1028, a transmission time of the emitted light pulse is determined based on the detected voltage. For example, the pulse emission time can be determined to be the time that the voltage is detected in the feedback loop. At block 1030, a reflected light pulse is received. The reflected light pulse can include at least a portion of the light pulse emitted in block 1024 that is reflected from a reflective object in an environment surrounding the LIDAR device. At block 1032, a reception time of the reflected light pulse is determined. At block 1034, a distance to the reflective object is determined based on both the time of reception of the reflected light signal and the transmission time (pulse emission time) determined for the light pulse emitted at block 1024. For example, the distance can be determined based on computing the round trip travel time to the reflective object from the difference of the reception time and emission time, multiplying by the speed of light in the surrounding environment and dividing by 2. At block 1036, the autonomous vehicle is navigated based at least in part on the determined distance to the reflective object. In some examples, one or more of the control systems 106 of the autonomous vehicle 100 described in connection with FIG. 1 may control the autonomous vehicle to avoid obstacles (e.g., the reflective object), navigate toward a predetermined destination, etc.

Figure 11:
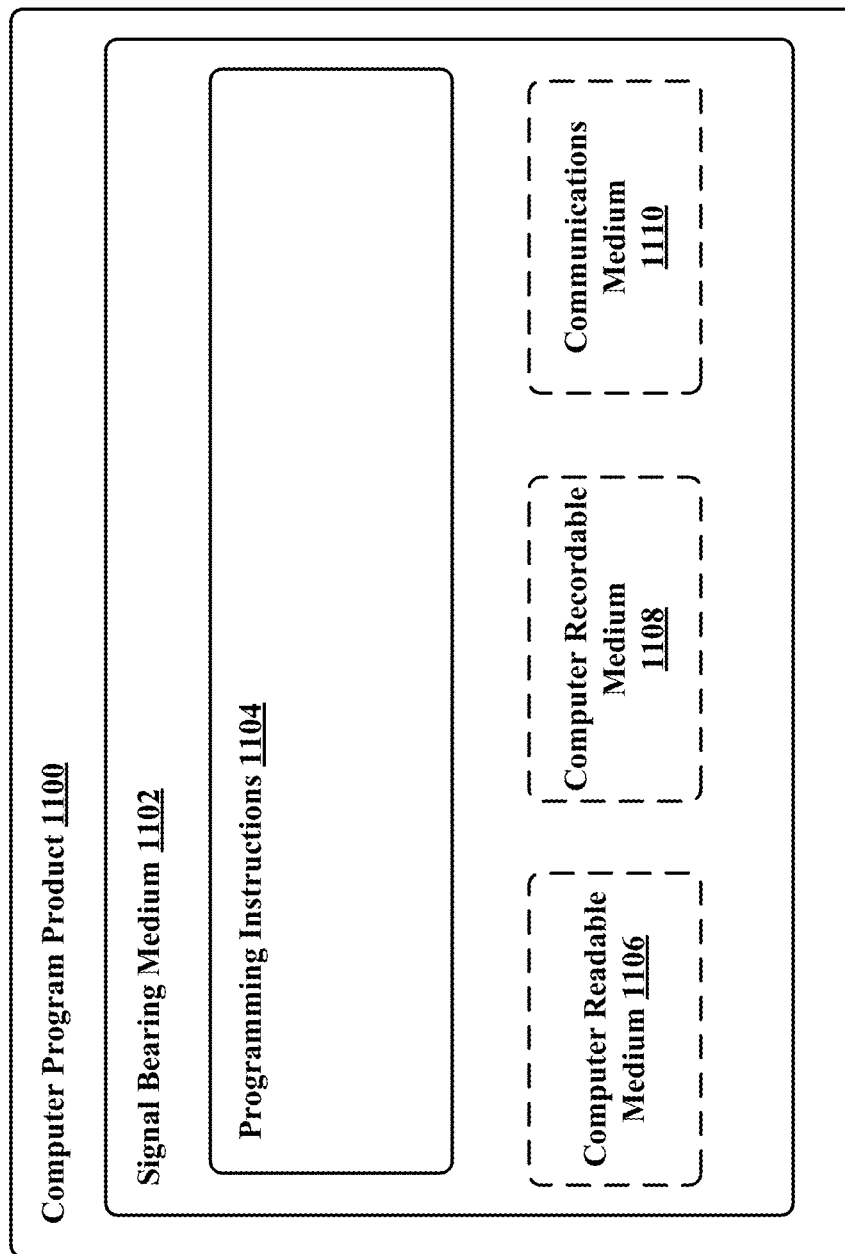
FIG. 11 depicts a non-transitory computer-readable medium configured according to an example embodiment.

FIG. 11 depicts a computer-readable medium configured according to an example embodiment. In example embodiments, the example system can include one or more processors, one or more forms of memory, one or more input devices/interfaces, one or more output devices/interfaces, and machine-readable instructions that when executed by the one or more processors cause the system to carry out the various functions, tasks, capabilities, etc., described above, such as the processes discussed in connection with FIGS. 10A and 10B above.

As noted above, in some embodiments, the disclosed techniques can be implemented by computer program instructions encoded on a non-transitory computer-readable storage media in a machine-readable format, or on other non-transitory media or articles of manufacture (e.g., the instructions 115 stored on the data storage 114 of the computer system 112 of vehicle 100). FIG. 11 is a schematic illustrating a conceptual partial view of an example computer program product 1100 that includes a computer program for executing a computer process on a computing device, arranged according to at least some embodiments presented herein.

In one embodiment, the example computer program product 1100 is provided using a signal bearing medium 1102. The signal bearing medium 1102 may include one or more programming instructions 1104 that, when executed by one or more processors may provide functionality or portions of the functionality described above with respect to FIGS. 1-10. In some examples, the signal bearing medium 1102 can be a non-transitory computer-readable medium 1106, such as, but not limited to, a hard disk drive, a Compact Disc (CD), a Digital Video Disk (DVD), a digital tape, memory, etc. In some implementations, the signal bearing medium 1102 can be a computer recordable medium 1108, such as, but not limited to, memory, read/write (R/W) CDs, R/W DVDs, etc. In some implementations, the signal bearing medium 1102 can be a communications medium 1110, such as, but not limited to, a digital and/or an analog communication medium (e.g., a fiber optic cable, a waveguide, a wired communications link, a wireless communication link, etc.). Thus, for example, the signal bearing medium 1102 can be conveyed by a wireless form of the communications medium 1110.

The one or more programming instructions 1104 can be, for example, computer executable and/or logic implemented instructions. In some examples, a computing device such as the computer system 112 of FIG. 1 is configured to provide various operations, functions, or actions in response to the programming instructions 1104 conveyed to the computer system 112 by one or more of the computer readable medium 1106, the computer recordable medium 1108, and/or the communications medium 1110.

The non-transitory computer readable medium could also be distributed among multiple data storage elements, which could be remotely located from each other. The computing device that executes some or all of the stored instructions could be a vehicle, such as the vehicle 200 illustrated in FIG. 2. Alternatively, the computing device that executes some or all of the stored instructions could be another computing device, such as a server.

While various example aspects and example embodiments have been disclosed herein, other aspects and embodiments will be apparent to those skilled in the art. The various example aspects and example embodiments disclosed herein are for purposes of illustration and are not intended to be limiting, with the true scope and spirit being indicated by the following claims.

What is claimed is:

1. A system comprising:
   a substrate;
   a firing circuit disposed on the substrate, wherein the firing circuit comprises a light emitting element and a transistor, wherein the light emitting element is configured to emit a pulse of light in response to a discharge current flowing through a current path comprising the light emitting element and the transistor;

a feedback loop disposed on the substrate, wherein the feedback loop comprises a first lead and a second lead; and a controller coupled to the first lead and the second lead, wherein the controller is configured to determine a time the pulse of light is emitted based on detecting a voltage between the first and second leads, wherein the controller is further configured to at least one of (i) output data indicative of the time the pulse of light is emitted or (ii) save in a memory data indicative of the time the pulse of light is emitted.

2. The system of claim 1, further comprising:
a driver circuit coupled to the transistor, wherein the driver circuit is configured to turn the transistor on and off.

3. The system of claim 2, wherein the firing circuit further comprises a capacitor and a voltage supply, wherein the capacitor is configured to be charged by the voltage supply in response to the driver circuit turning the transistor off, and wherein the capacitor is configured to discharge to provide the discharge current that flows through the current path in response to the driver circuit turning the transistor on.

4. The system of claim 2, wherein the controller is configured to control the driver circuit.

5. The system of claim 1, wherein the transistor is an avalanche transistor or a Gallium nitride field effect transistor (GaNFET).

6. The system of claim 1, wherein the light emitting element is a laser diode.

7. The system of claim 1, wherein the substrate comprises a printed circuit board (PCB).

8. The system of claim 7, wherein the firing circuit is disposed on a first side of the PCB and the feedback loop on a second side of the PCB, wherein the second side is opposite the first side.

9. The system of claim 7, wherein the firing circuit is disposed on at least one side of the PCB and the feedback loop is disposed in an internal layer of the PCB.

10. The system of claim 1, wherein the voltage between the first and second leads is induced in response to the discharge current flowing through the current path.

11. A method comprising:
emitting a pulse of light from a light emitting element in response to a discharge current flowing through a current path comprising the light emitting element and a transistor, wherein the light emitting element and the transistor are in a firing circuit disposed on a substrate;
developing a voltage between a first lead and a second lead of a feedback loop disposed on the substrate in response to the discharge current flowing through a current path;
detecting the voltage developed between the first and second leads of the feedback loop;
determining a time the pulse of light is emitted based on the detected voltage; and
generating data indicative of the time the pulse of light is emitted.

12. The method of claim 11, wherein the feedback loop is inductively coupled to the current path.

13. The method of claim 11, wherein the firing circuit further comprises a capacitor and a voltage supply.

14. The method of claim 13, further comprising:
turning the transistor off, and
in response to turning the transistor off, charging the capacitor by the voltage supply.

15. The method of claim 14, further comprising:
turning the transistor on; and
in response to turning the transistor on, discharging the capacitor to provide the discharge current flowing the current path.

16. A light detection and ranging (LIDAR) device comprising:
a substrate;
a firing circuit disposed on the substrate, wherein the firing circuit comprises a light emitting element and a transistor, wherein the light emitting element is configured to emit a pulse of light in response to a discharge current flowing through a current path comprising the light emitting element and the transistor;
a feedback loop disposed on the substrate, wherein the feedback loop comprises a first lead and a second lead; and
a controller coupled to the first lead and the second lead, wherein the controller is configured to determine a time the pulse of light is emitted based on detecting a voltage between the first and second leads, wherein the controller is further configured to at least one of (i) output data indicative of the time the pulse of light is emitted or (ii) save in a memory data indicative of the time the pulse of light is emitted.

17. The LIDAR device of claim 16, further comprising:
a driver circuit coupled to the transistor, wherein the driver circuit is configured to turn the transistor on and off.

18. The LIDAR device of claim 17, wherein the firing circuit further comprises a capacitor and a voltage supply, wherein the capacitor is configured to be charged by the voltage supply in response to the driver circuit turning the transistor off, and wherein the capacitor is configured to discharge to provide the discharge current that flows through the current path in response to the driver circuit turning the transistor on.

19. The LIDAR device of claim 17, wherein the controller is configured to control the driver circuit.

20. The LIDAR device of claim 16, wherein the voltage between the first and second leads is induced in response to the discharge current flowing through the current path.

* * * * *